US012787219B2

(12) United States Patent
Hara

(10) Patent No.: US 12,787,219 B2
(45) Date of Patent: Nov. 3, 2026

(54) MONITORING DEVICE

(71) Applicant: MITSUBISHI HEAVY INDUSTRIES, LTD., Tokyo (JP)

(72) Inventor: Nobuhide Hara, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 98 days.

(21) Appl. No.: 18/836,413

(22) PCT Filed: Dec. 23, 2022

(86) PCT No.: PCT/JP2022/047750

§ 371 (c)(1),
(2) Date: Aug. 7, 2024

(87) PCT Pub. No.: WO2023/157474

PCT Pub. Date: Aug. 24, 2023

(65) Prior Publication Data

US 2025/0142772 A1 May 1, 2025

(30) Foreign Application Priority Data

Feb. 17, 2022 (JP) ................................ 2022-022968

(51) Int. Cl.
*H05K 7/20* (2006.01)

(52) U.S. Cl.
CPC ..... *H05K 7/20272* (2013.01); *H05K 7/20263* (2013.01); *H05K 7/203* (2013.01)

(58) Field of Classification Search
CPC .............................. H05K 7/203; H10W 40/44
See application file for complete search history.

(56) References Cited

U.S. PATENT DOCUMENTS

2019/0008077 A1 1/2019 Ishinabe
2019/0166726 A1 5/2019 Tung et al.
(Continued)

FOREIGN PATENT DOCUMENTS

CN 201193861 Y 2/2009
JP 1-230997 A 9/1989
(Continued)

OTHER PUBLICATIONS

International Search Report for International Application No. PCT/JP2022/047750, dated Mar. 7, 2023, with an English translation.
(Continued)

*Primary Examiner* — Eric S Ruppert
(74) *Attorney, Agent, or Firm* — Birch, Stewart, Kolasch & Birch, LLP

(57) ABSTRACT

A monitoring device for a cooling device, the cooling device includes a first refrigerant for removing heat from electronic equipment in a closed space, a second refrigerant that has exchanged heat with the first refrigerant using air outside the refrigerant tank, an acquisition unit that acquires at least one set of a set including a temperature of the second refrigerant flowing into a heat exchanger in the dry cooler and a temperature of the second refrigerant flowing out of the heat exchanger, and a set including a temperature of the air flowing into the heat exchanger and a temperature of the air flowing out of the heat exchanger, and a determination unit that compares an optimal temperature corresponding to an outside temperature and a load of the electronic equipment with each of the temperatures acquired by the acquisition unit to determine whether an abnormality has occurred.

4 Claims, 10 Drawing Sheets

(56) References Cited

U.S. PATENT DOCUMENTS

| | | | | |
|---|---|---|---|---|
| 2020/0267872 | A1 | 8/2020 | Harada et al. | |
| 2020/0305310 | A1* | 9/2020 | Alissa | H05K 7/203 |

FOREIGN PATENT DOCUMENTS

| | | | | |
|---|---|---|---|---|
| JP | 2004122038 | A | * | 4/2004 |
| JP | 2015-161746 | A | | 9/2015 |
| JP | 2019-12470 | A | | 1/2019 |
| JP | 2020-136335 | A | | 8/2020 |
| JP | 6817787 | B2 | | 1/2021 |

OTHER PUBLICATIONS

Written Opinion of the International Searching Authority for International Application No. PCT/JP2022/047750, dated Mar. 7, 2023, with an English translation.

* cited by examiner

MONITORING DEVICE

TECHNICAL FIELD

The present disclosure relates to a monitoring device.

Priority is claimed on Japanese Patent Application No. 2022-022968, filed Feb. 17, 2022, the content of which is incorporated herein by reference.

BACKGROUND ART

For example, Patent Literature 1 discloses a cooling system in which a primary refrigerant for cooling a server is cooled by a secondary refrigerant, and the secondary refrigerant is cooled by exchanging heat with outside air. A temperature, a liquid level, and the like (state of a heat medium) indicated by the heat medium that cools the server in a data center or the like are required to be managed by a control device or the like from the viewpoint of securing the efficiency of cooling.

For example, Patent Literature 2 discloses technology for predicting a decrease in refrigerant based on a measurement result obtained by a liquid level sensor and automatically supplying a refrigerant from a refrigerant storage device to a pump cycle.

CITATION LIST

Patent Literature

[Patent Literature 1]

Japanese Unexamined Patent Application, First Publication No. 2020-136335

[Patent Literature 2]

Japanese Patent No. 6817787

SUMMARY OF INVENTION

Technical Problem

In a field of cooling devices for cooling servers, technology for stabilizing the state of a heat medium is required.

The present disclosure has been made to solve the above-described problems, and an object of the present disclosure is to provide a monitoring device that can stabilize the state of a heat medium in a cooling device.

Solution to Problem

In order to solve the above problems, a monitoring device according to the present disclosure monitors an abnormality of a cooling device, wherein the cooling device includes a refrigerant tank that accommodates a first refrigerant for removing heat from electronic equipment in a closed space, a dry cooler that cools a second refrigerant that has exchanged heat with the first refrigerant using air outside the refrigerant tank, and a circulation pump that causes the second refrigerant to circulate between the refrigerant tank and the dry cooler through a second refrigerant line, the monitoring device including an acquisition unit that acquires at least one set of a set including a temperature of the second refrigerant flowing into a heat exchanger in the dry cooler and a temperature of the second refrigerant flowing out of the heat exchanger, and a set including a temperature of the air flowing into the heat exchanger and a temperature of the air flowing out of the heat exchanger, and a determination unit that compares an optimal temperature corresponding to an outside temperature and a load of the electronic equipment with each of the temperatures acquired by the acquisition unit to determine whether an abnormality has occurred in one or more of the dry cooler and the circulation pump.

A monitoring device according to the present disclosure monitors an abnormality of a cooling device, wherein the cooling device includes a refrigerant tank that accommodates a first refrigerant for removing heat from electronic equipment in a closed space, a dry cooler that cools a second refrigerant that has exchanged heat with the first refrigerant using air outside the refrigerant tank, a separate tank that accommodates the first refrigerant independently of the refrigerant tank, and a replenishing pump that is driven to allow the first refrigerant to be supplied from the separate tank to the refrigerant tank through a refrigerant replenishing line, the monitoring device including an acquisition unit that acquires a liquid level of the first refrigerant in the refrigerant tank, a determination unit that determines whether the first refrigerant is leaking from the refrigerant tank based on the liquid level acquired by the acquisition unit, and a refrigerant replenishing unit that drives the replenishing pump when the determination unit determines that the first refrigerant is leaking from the refrigerant tank.

Advantageous Effects of Invention

According to the present disclosure, it is possible to provide a monitoring device that can stabilize the state of a heat medium in a cooling device.

DESCRIPTION OF EMBODIMENTS

Hereinafter, a cooling system according to an embodiment of the present disclosure will be described based on the drawings.

First Embodiment (Cooling System)

Figure 1:
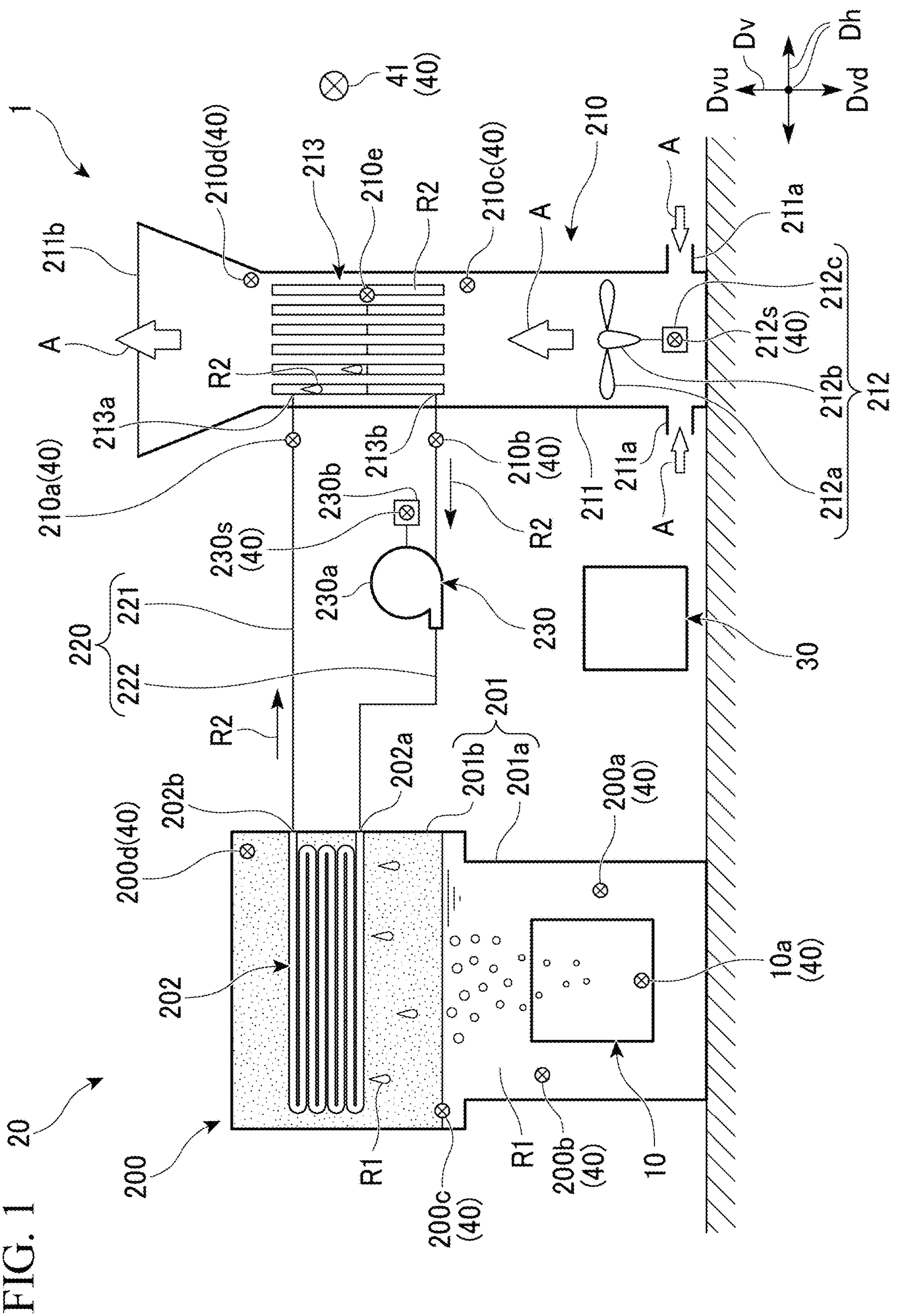
FIG. 1 is a diagram showing a configuration of a cooling system according to a first embodiment of the present disclosure.

The cooling system in this embodiment is a system for cooling electronic equipment such as servers in facilities such as data centers. As shown in FIG. 1, a cooling system 1 in this embodiment includes a server 10 (electronic equipment), a cooling device 20, various sensors 40, and a monitoring device 30.

(Server)

The server 10 is an information processing device that is connected to a device outside the cooling system 1 in a wired manner and computes a large amount of data transmitted from the outside. Specifically, the server 10 receives a data signal indicating a request from an external Internet user from an external device, and returns a data signal indicating a response to this request to the Internet user. The server 10 generates heat and reaches a high temperature by computing the large amount of data.

(Cooling System)

The cooling device 20 is an immersion cooling device that cools a first refrigerant R1 for cooling the server 10 by causing the first refrigerant R1, a second refrigerant R2, and air A as heat media to exchange heat with one another. As the first refrigerant R1, for example, a special refrigerant having a boiling point in the range of 40° C. to 60° C. is used. For example, water ($H_2O$) is used as the second refrigerant R2. Thus, the second refrigerant R2 in this embodiment is in a liquid state. The cooling device 20 in this embodiment includes a refrigerant tank 200, a dry cooler 210, a second refrigerant line 220, and a circulation pump 230.

(Refrigerant Tank)

The refrigerant tank 200 accommodates the first refrigerant R1 in a closed space and causes the first refrigerant R1 and the second refrigerant R2 to exchange heat with each other. The refrigerant tank 200 includes a refrigerant tank main body 201 that stores a liquid primary refrigerant therein, and a condenser 202 that is accommodated in the refrigerant tank main body 201 and is disposed on an upward side Dvu of the liquid primary refrigerant in the refrigerant tank main body 201.

Hereinafter, for convenience of description, a vertical direction (vertical direction in FIG. 1) that matches a direction in which gravity acts will be simply referred to as a "vertical direction Dv". Further, an upward side in the vertical direction Dv (upper side in FIG. 1) will be simply referred to as an "upward side Dvu". Further, a side opposite to the upward side Dvu (lower side in FIG. 1) will be simply referred to as a "downward side Dvd". Further, a horizontal direction perpendicular to gravity will be simply referred to as a "horizontal direction Dh".

The refrigerant tank main body 201 includes a first tank 201*a* fixed to the ground, a pedestal, or the like and a second tank 201*b* integrally connected to the first tank 201*a* from the upward side Dvu. The first tank 201*a* and the second tank 201*b* in this embodiment have a rectangular parallelepiped shape and are made of a metal or the like. The second tank 201*b* is formed to have a larger dimension in the horizontal direction Dh than the first tank 201*a*. The liquid level of the first refrigerant R1 stored in the refrigerant tank main body 201 is positioned in the second tank 201*b* on the upward side Dvu of the first tank 201*a*. That is, the inside of the first tank 201*a* is filled with the first refrigerant R1.

Here, the server 10 is immersed in the first refrigerant R1 in a liquid state within the refrigerant tank main body 201. The server 10 is disposed in the first tank 201*a*. The server 10 evaporates the first refrigerant R1 by generating heat. This evaporation action generates vaporization heat, and the heat of the server 10 is taken away by the first refrigerant R1. That is, the refrigerant tank 200 cools the server 10 by boiling latent heat cooling. When the cooling system 1 in this embodiment is operating normally, the temperature of the first refrigerant R1 in the refrigerant tank main body 201 is maintained in the range of, for example, 40° C. to 60° C. The first refrigerant R1 in a gaseous state (bubbles) in the vicinity of the server 10 moves to the upward side Dvu and joins the atmosphere in the second tank 201*b*. The outer surface of equipment forming the outer shell of the server 10 is protected by waterproofing or the like not to be flooded with water.

The condenser 202 is disposed within the second tank 201*b*. Specifically, the condenser 202 is fixed to the inner wall of the second tank 201*b* on the upward side Dvu of the liquid level of the first refrigerant R1. The condenser 202 is configured by a plurality of metal tubes connected to each other. The condenser 202 includes a condenser inlet portion 202*a* through which the second refrigerant R2 can be introduced from the outside, and a condenser outlet portion 202*b* through which the second refrigerant R2 flowing through the plurality of metal tubes can be discharged to the outside. The condenser outlet portion 202*b* is disposed on the upward side Dvu of the condenser inlet portion 202*a*.

Here, the inside of the condenser 202 (the inside of each of the plurality of metal tubes) is airtightly isolated from the inside of the refrigerant tank main body 201. The second refrigerant R2 flowing into the condenser 202 from the outside through the condenser inlet portion 202*a* exchanges heat with the first refrigerant R1 in a gaseous state through a tube wall within the condenser 202. After completing the heat exchange, the second refrigerant R2 flows to the outside through the condenser outlet portion 202*b*. That is, in the second tank 201*b*, the first refrigerant R1 is cooled by the second refrigerant R2, and the second refrigerant R2 is warmed by the first refrigerant R1. The first refrigerant R1 in a gaseous state cooled by the second refrigerant R2 condenses into a liquid, moves (falls) to the downward side Dvd, and joins the stored first refrigerant R1 in a liquid state. On the other hand, the second refrigerant R2 warmed by the first refrigerant R1 moves to the upward side Dvu in the condenser 202 and flows to the outside through the condenser outlet portion 202*b*. When the cooling system 1 in this embodiment is operating normally, the pressure of the atmosphere inside the refrigerant tank main body 201 is maintained in a range of, for example, 100 PaA to 500 kPaA.

(Dry Cooler)

The dry cooler 210 is a device that cools the second refrigerant R2 exchanging heat with the first refrigerant R1 by using the air A. That is, the dry cooler 210 causes the second refrigerant R2 and the air A to exchange heat. The dry cooler 210 is disposed to be spaced apart from the refrigerant tank 200 in the horizontal direction Dh. The dry cooler 210 includes a casing 211, a fan 212, and a heat exchanger 213.

The casing 211 is fixed to the ground, a pedestal, or the like. The casing 211 has a cylindrical shape extending in the vertical direction Dv. An intake port 211*a* through which the air A can be introduced from the outside is formed at an end of the casing 211 on the downward side Dvd, and an exhaust port 211*b* from which the introduced air A can be discharged toward the upward side Dvu is formed at an end of the casing 211 on the upward side Dvu. The air A flowing into the casing 211 through the intake port 211*a* flows through the casing 211 toward the upward side Dvu and is then discharged to the upward side Dvu of the casing 211 through the exhaust port 211*b*.

The fan 212 is a blower disposed inside the casing 211. The fan 212 is driven to take the air A into the casing 211 from the outside through the intake port 211*a* and pressure-feed the introduced air A toward the upward side Dvu within the casing 211. The fan 212 includes a plurality of blades 212*a*, a shaft portion 212*b* that supports the plurality of blades 212*a*, and a fan motor 212*c* that is connected to the shaft portion 212*b*. When the fan motor 212*c* rotates, the shaft portion 212*b* rotates, and the blades 212*a* connected to the shaft portion 212*b* are rotated within the casing 211.

The heat exchanger 213 is disposed within the casing 211. Specifically, the heat exchanger 213 is fixed to the inner wall of the casing 211 on the upward side Dvu of the fan 212. The heat exchanger 213 is configured by a plurality of metal tubes extending in the vertical direction Dv being disposed side by side in the horizontal direction Dh. The condenser 202 includes a heat exchanger inlet portion 213*a* through which the second refrigerant R2 can be introduced from the outside into some of the plurality of metal tubes, and a heat exchanger outlet portion 213*b* through which the second refrigerant R2 flowing through some of the metal tubes can be discharged to the outside. The heat exchanger outlet portion 213*b* is disposed on the downward side Dvd of the heat exchanger inlet portion 213*a*. In this embodiment, for convenience of description, the inside of each of the above-mentioned some of the metal tubes through which the second refrigerant R2 flows is referred to as a “refrigerant passage”.

The refrigerant passage is airtightly isolated from the inside of the casing 211. The second refrigerant R2 that has flowed into the refrigerant passage from the outside through the heat exchanger inlet portion 213*a* exchanges heat with the air A that flows through the casing 211 toward the upward side Dvu via a tube wall in the refrigerant passage. After completing the heat exchange, the second refrigerant R2 flows out of the refrigerant passage through the heat exchanger outlet portion 213*b*. That is, the second refrigerant R2 is cooled by the air A, and the air A is warmed by the second refrigerant R2. The second refrigerant R2 cooled by the air A flows to the downward side Dvd and flows to the outside through the heat exchanger outlet portion 213*b*. On the other hand, the air A warmed by the second refrigerant R2 moves to the upward side Dvu and is discharged to the outside through the exhaust port 211*b*. When the cooling system 1 in this embodiment is operating normally, the temperature of the air A introduced into the casing 211 before heat exchange is maintained in the range of, for example, 0° C. to 40° C., and the temperature of the air A discharged from the casing 211 after heat exchange is maintained in the range of, for example, 35° C. to 55° C.

(Second Refrigerant Line)

The second refrigerant line 220 is a tube for making the second refrigerant R2 flow back and forth between the refrigerant tank 200 and the dry cooler 210. The second refrigerant line 220 includes a high temperature line 221 through which the second refrigerant R2, which has completed heat exchange in the refrigerant tank 200, flows from the refrigerant tank 200 side toward the dry cooler 210 side, and a low temperature line 222 through which the second refrigerant R2, which has completed heat exchange in the dry cooler 210, flows from the dry cooler 210 side toward the refrigerant tank 200 side. That is, the temperature of the second refrigerant R2 flowing through the high temperature line 221 is higher than the temperature of the second refrigerant R2 flowing through the low temperature line 222. The high temperature line 221 and the low temperature line 222 are formed of a metal or the like.

When the cooling system 1 in this embodiment is operating normally, the temperature of the second refrigerant R2 flowing through the high temperature line 221 is maintained in the range of, for example, 35° C. to 55° C., and the temperature of the second refrigerant R2 flowing through the low temperature line 222 is maintained in the range of, for example, 30° C. to 50° C.

The high temperature line 221 connects the condenser outlet portion 202*b* of the condenser 202 in the refrigerant tank 200 and the heat exchanger inlet portion 213*a* of the heat exchanger 213 in the dry cooler 210. The low temperature line 222 connects the heat exchanger outlet portion 213*b* of the heat exchanger 213 in the dry cooler 210 and the condenser inlet portion 202*a* of the condenser 202 in the refrigerant tank 200. In this embodiment, the condenser 202 of the refrigerant tank 200, the heat exchanger 213 of the dry cooler 210, and the second refrigerant line 220 form a closed loop that is a flow path for the second refrigerant R2.

(Circulation Pump)

The circulation pump 230 is a pump that causes the second refrigerant R2 to circulate between the refrigerant tank 200 and the dry cooler 210 through the second refrigerant line 220. The circulation pump 230 is disposed in the middle of the low temperature line 222 in the second refrigerant line 220. The circulation pump 230 is driven to pressure-feed the second refrigerant R2 in the low temperature line 222 from the dry cooler 210 side toward the refrigerant tank 200 side.

The circulation pump 230 includes a pump main body 230*a* having a plurality of impellers (not shown), and a pump motor 230*b* connected to the pump main body 230*a*. When the pump motor 230*b* rotates, the impellers in the pump main body 230*a* rotate. Thereby, the second refrigerant R2 circulates in the order of the low temperature line 222, the condenser 202, the high temperature line 221, the heat exchanger 213, and the low temperature line 222.

(Various Sensors)

The various sensors 40 measure the environmental state around the cooling device 20 and the state of various pieces of equipment included in the cooling device 20. The various sensors 40 in this embodiment include an outside temperature sensor 41, a load sensor 10*a*, a conductivity sensor 200*a*, a first refrigerant temperature sensor 200*b*, a first liquid level sensor 200*c*, an internal pressure sensor 200*d*, a refrigerant inlet temperature sensor 210*a*, a refrigerant outlet temperature sensor 210*b*, an air inlet temperature sensor 210*c*, an air outlet temperature sensor 210*d*, a second liquid level sensor 210*e*, a first current sensor 212*s*, and a second current sensor 230*s*.

The outside temperature sensor 41 is a temperature sensor that measures the temperature of outside air. When the cooling system 1 is installed in a server room, the outside temperature sensor 41 measures the temperature of the air A in the server room. The outside temperature sensor 41 transmits the measured outside temperature to the monitoring device 30 outside the cooling device 20 at predetermined timings (time intervals). For example, the outside temperature sensor 41 is disposed in the vicinity of the dry cooler 210.

The load sensor 10*a* is a sensor that measures a load applied to the server 10. Specifically, the load sensor 10*a* measures power consumption (kW), which is obtained by measuring a current value (A) and a voltage value (V) input to the server 10, as a load applied to the server 10 (hereinafter referred to as a server load). The load sensor 10*a* transmits a signal indicating the measured server load to the monitoring device 30 at a predetermined timing. The load sensor 10*a* is disposed, for example, in the vicinity of the server 10 in the first refrigerant R1 in the first tank 201*a*. Thus, the load sensor 10*a* is immersed in the first refrigerant R1.

The conductivity sensor 200*a* is a sensor that measures the conductivity of the first refrigerant R1 in a liquid state within the refrigerant tank main body 201. The conductivity sensor 200*a* includes a positive terminal and a negative terminal, and acquires a conductivity based on the magnitude of a resistance value between these terminals. The conductivity sensor 200*a* transmits a signal indicating the measured conductivity to the monitoring device 30 at a predetermined timing. The conductivity sensor 200*a* is disposed, for example, in the first refrigerant R1 in the first tank 201*a*. Thus, the conductivity sensor 200*a* is immersed in the first refrigerant R1.

The first refrigerant temperature sensor 200*b* is a temperature sensor that measures the temperature of the first refrigerant R1 in a liquid state within the refrigerant tank main body 201. The first refrigerant temperature sensor 200*b* includes a probe such as a thermocouple, and measures the temperature of the first refrigerant R1 by immersing the probe in the first refrigerant R1 inside the refrigerant tank main body 201. The first refrigerant temperature sensor 200*b* transmits a signal indicating the measured temperature of the first refrigerant R1 to the monitoring device 30 at a predetermined timing. The first refrigerant temperature sensor 200*b* is disposed, for example, within the refrigerant tank main body 201.

The first liquid level sensor 200*c* is a level sensor that measures the liquid level (height of the liquid surface) of the first refrigerant R1 in a liquid state within the refrigerant tank main body 201. The first liquid level sensor 200*c* transmits a signal indicating the measured liquid level of the first refrigerant R1 to the monitoring device 30 at a predetermined timing. The first liquid level sensor 200*c* is disposed, for example, within the second tank 201*b*.

The internal pressure sensor 200*d* is an atmospheric pressure sensor that measures the atmospheric pressure inside the refrigerant tank main body 201. The internal pressure sensor 200*d* transmits a signal indicating the measured atmospheric pressure to the monitoring device 30 at a predetermined timing. The internal pressure sensor 200*d* is disposed, for example, in a space in the first tank 201*a* where the first refrigerant R1 is not stored.

The refrigerant inlet temperature sensor 210*a* is a temperature sensor that measures the temperature of the second refrigerant R2 flowing through the high temperature line 221 of the second refrigerant line 220 from the refrigerant tank 200 side toward the dry cooler 210 side. That is, the refrigerant inlet temperature sensor 210*a* measures the temperature of the second refrigerant R2 that has completed heat exchange in the condenser 202. The refrigerant inlet temperature sensor 210*a* includes a probe such as a thermocouple, and measures the temperature of the second refrigerant R2 in the high temperature line 221 when the probe comes into contact with the second refrigerant R2 flowing through the high temperature line 221. The refrigerant inlet temperature sensor 210*a* transmits a signal indicating the measured temperature of the second refrigerant R2 to the monitoring device 30 at a predetermined timing. The refrigerant inlet temperature sensor 210*a* is disposed, for example, in the vicinity of the heat exchanger inlet portion 213*a* in the high temperature line 221.

The refrigerant outlet temperature sensor 210*b* is a temperature sensor that measures the temperature of the second refrigerant R2 flowing through the low temperature line 222 of the second refrigerant line 220 from the dry cooler 210 side toward the refrigerant tank 200 side. That is, the refrigerant inlet temperature sensor 210*a* measures the temperature of the second refrigerant R2 before performing heat exchange in the condenser 202. The refrigerant outlet temperature sensor 210*b* includes a probe such as a thermocouple, and measures the temperature of the second refrigerant R2 in the low temperature line 222 when the probe comes into contact with the second refrigerant R2 flowing through the low temperature line 222. The refrigerant outlet temperature sensor 210*b* transmits a signal indicating the measured temperature of the second refrigerant R2 to the monitoring device 30 at a predetermined timing. The refrigerant outlet temperature sensor 210*b* is disposed, for example, in the vicinity of the heat exchanger outlet portion 213*b* within the low temperature line 222 on a side closer to the dry cooler 210 than the circulation pump 230.

The air inlet temperature sensor 210*c* is a temperature sensor that measures the temperature of the air A flowing through the casing 211 of the dry cooler 210 toward the upward side Dvu. The air inlet temperature sensor 210*c* measures the temperature of the air A before the air A flows into the heat exchanger 213 (before heat exchange). The air inlet temperature sensor 210*c* includes a probe such as a thermocouple, and measures the temperature of the air A in the casing 211 when the probe comes into contact with the air A flowing through the casing 211. The air inlet temperature sensor 210*c* transmits a signal indicating the measured temperature of the air A before heat exchange to the monitoring device 30 at a predetermined timing. The air inlet temperature sensor 210*c* is disposed, for example, to be closer to the upward side Dvu than the fan 212 and to be closer to the downward side Dvd than the heat exchanger 213 in the casing 211.

The air outlet temperature sensor 210*d* is a temperature sensor that measures the temperature of the air A flowing through the casing 211 of the dry cooler 210 toward the upward side Dvu. The air outlet temperature sensor 210*d* measures the temperature of the air A flowing out of the heat exchanger 213 (after heat exchange). The air outlet temperature sensor 210*d* includes a probe such as a thermocouple, and measures the temperature of the air A in the casing 211 when the probe comes into contact with the air A flowing through the casing 211. The air outlet temperature sensor 210*d* transmits a signal indicating the measured temperature of the air A after heat exchange to the monitoring device 30 at a predetermined timing. The air outlet temperature sensor 210*d* is disposed, for example, to be closer to the upward side Dvu than the heat exchanger 213 in the casing 211.

The second liquid level sensor 210*e* is a level sensor that measures the liquid level (height of the liquid surface) of the second refrigerant R2 in the heat exchanger 213. The second liquid level sensor 210*e* transmits a signal indicating the measured liquid level of the second refrigerant R2 to the monitoring device 30 at a predetermined timing. The second liquid level sensor 210*e* is disposed, for example, in a refrigerant passage within the heat exchanger 213.

The first current sensor **212*s* is a current sensor that measures the magnitude (current value) of a current flowing through the fan motor 212*c* of the fan 212. The first current sensor 212*s* transmits a signal indicating the measured current value to the monitoring device 30 at a predetermined timing. The first current sensor 212*s* is electrically connected to the fan motor 212*c***.

The second current sensor **230*s* is a current sensor that measures the magnitude (current value) of a current flowing through the pump motor 230*b* in the circulation pump 230. The second current sensor 230*s* transmits a signal indicating the measured current value to the monitoring device 30 at a predetermined timing. The second current sensor 230*s* is electrically connected to the pump motor 230*b***.

(Monitoring Device)

Figure 2:
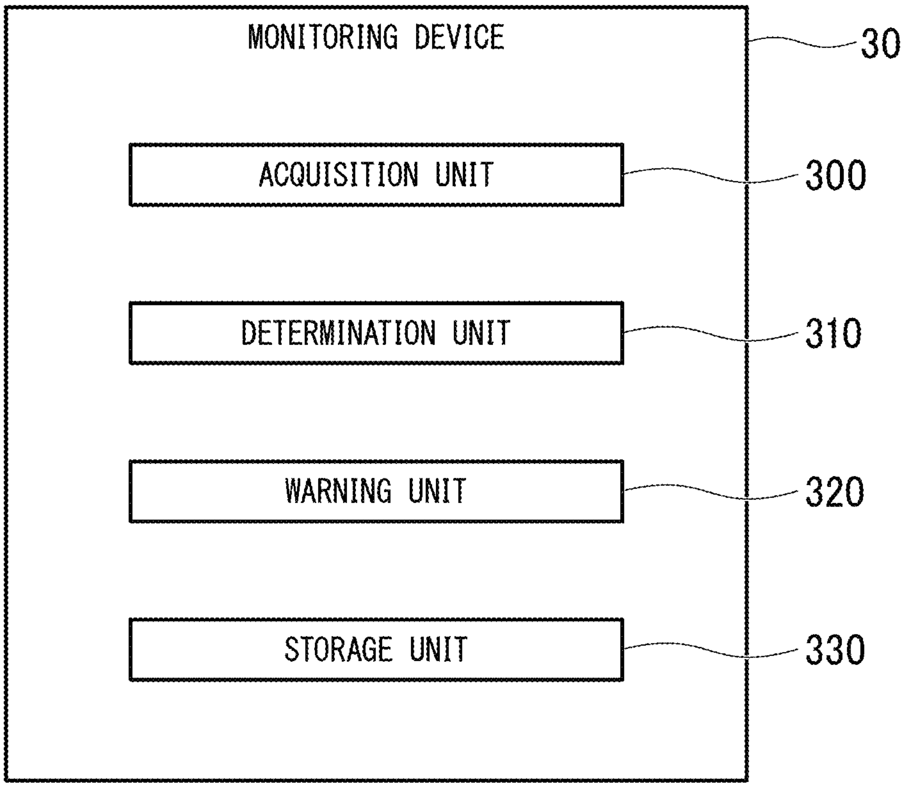
FIG. 2 is a functional block diagram of a monitoring device according to the first embodiment of the present disclosure.

The monitoring device 30 is a device that acquires data measured by the various sensors 40 described above and determines whether an abnormality has occurred in the equipment based on the acquired data. The monitoring device 30 is connected to the various sensors 40 described above in a wired or wireless manner. As shown in FIG. 2, the monitoring device 30 includes an acquisition unit 300, a determination unit 310, a warning unit 320, and a storage unit 330.

(Acquisition Unit)

The acquisition unit 300 receives signals measured by the various sensors 40 described above, and acquires the received environmental state data around the cooling device 20 and state data of various pieces of equipment included in the cooling device 20 at the same timing.

(Acquisition from Outside Temperature Sensor)

The acquisition unit 300 receives a signal transmitted from the outside temperature sensor 41 to acquire data on the temperature of the indoor air A indicated by the signal. The acquisition unit 300 transmits the acquired data of the temperature of the indoor air A to the determination unit 310.

(Acquisition from Load Sensor)

The acquisition unit 300 receives a signal transmitted from the load sensor **10*a* to acquire data on a server load which is indicated by the signal. The acquisition unit 300 transmits the acquired data on the server load to the determination unit 310**.

(Acquisition from Conductivity Sensor)

The acquisition unit 300 receives a signal transmitted from the conductivity sensor **200*a* to acquire data on the conductivity of the first refrigerant R1 in a liquid state within the refrigerant tank main body 201 which is indicated by the signal. The acquisition unit 300 transmits the acquired data on the conductivity of the first refrigerant R1 to the determination unit 310**.

(Acquisition from First Refrigerant Temperature Sensor)

The acquisition unit 300 receives a signal transmitted from the first refrigerant temperature sensor **200*b* to acquire data on the temperature of the first refrigerant R1 in a liquid state within the refrigerant tank main body 201 which is indicated by the signal. The acquisition unit 300 transmits the acquired temperature data of the first refrigerant R1 to the determination unit 310**.

(Acquisition from First Liquid Level Sensor)

The acquisition unit 300 receives a signal transmitted from the first liquid level sensor **200*c* to acquire data on the liquid level of the first refrigerant R1 in a liquid state within the refrigerant tank main body 201 which is indicated by the signal. The acquisition unit 300 transmits the acquired data on the liquid level of the first refrigerant R1 to the determination unit 310**.

(Acquisition from Internal Pressure Sensor)

The acquisition unit 300 receives a signal transmitted from the internal pressure sensor **200*d* to acquire data on the atmospheric pressure inside the refrigerant tank main body 201 which is indicated by the signal. The acquisition unit 300 transmits the acquired data on the atmospheric pressure inside the refrigerant tank main body 201 to the determination unit 310**.

(Acquisition from Refrigerant Inlet Temperature Sensor)

The acquisition unit 300 receives a signal transmitted from the refrigerant inlet temperature sensor **210*a* to acquire data on the temperature of the second refrigerant R2, which flows through the high temperature line 221 from the refrigerant tank 200 side toward the dry cooler 210 side, which is indicated by the signal. The acquisition unit 300 transmits the acquired temperature of the second refrigerant R2 flowing through the high temperature line 221 to the determination unit 310**.

(Acquisition from Refrigerant Outlet Temperature Sensor)

The acquisition unit 300 receives a signal transmitted from the refrigerant outlet temperature sensor **210*b* to acquire data on the temperature of the second refrigerant R2, which flows through the low temperature line 222 from the dry cooler 210 side toward the refrigerant tank 200 side, which is indicated by the signal. The acquisition unit 300 transmits the acquired data on the temperature of the second refrigerant R2 flowing through the low temperature line 222 to the determination unit 310**.

(Acquisition from Air Inlet Temperature Sensor)

The acquisition unit 300 receives a signal transmitted from the air inlet temperature sensor **210*c* to acquire data on the temperature of air A before heat exchange in the dry cooler 210 which is indicated by the signal. The acquisition unit 300 transmits the acquired data on the temperature of the air A before heat exchange to the determination unit 310**.

(Acquisition from Air Outlet Temperature Sensor)

The acquisition unit 300 receives a signal transmitted from the air outlet temperature sensor **210*d* to acquire data on the temperature of the air A after heat exchange in the dry cooler 210 which is indicated by the signal. The acquisition unit 300 transmits the acquired data on the temperature of the air A after the heat exchange to the determination unit 310**.

(Acquisition from Second Liquid Level Sensor)

The acquisition unit 300 receives a signal transmitted from the second liquid level sensor **210*e* to acquire data on the liquid level of the second refrigerant R2 in the heat exchanger 213 which is indicated by the signal. The acquisition unit 300 transmits the acquired data on the liquid level of the second refrigerant R2 to the determination unit 310**.

(Acquisition from First Current Sensor)

The acquisition unit 300 receives a signal transmitted from the first current sensor **212*s* to acquire data on the magnitude of a current flowing to the fan motor 212*c* indicated by the signal. The acquisition unit 300 transmits the acquired data on the magnitude of the current flowing to the fan motor 212*c* to the determination unit 310**.

(Acquisition from Second Current Sensor)

The acquisition unit 300 receives a signal transmitted from the second current sensor **230*s* to acquire data on the magnitude of a current flowing to the pump motor 230*b* which is indicated by the signal. The acquisition unit 300 transmits the acquired data on the magnitude of the current flowing to the pump motor 230*b* to the determination unit 310**.

(Determination Unit)

The determination unit 310 performs determination processing based on environmental state data around the cooling device 20 and state data of various pieces of equipment included in the cooling device 20 which are received from the acquisition unit 300, and various predetermined values stored in the storage unit 330 in advance. In this embodiment, a case where various pieces of data received from the outside temperature sensor 41, the load sensor 10*a*, the refrigerant inlet temperature sensor 210*a*, the refrigerant outlet temperature sensor 210*b*, the air inlet temperature sensor 210*c*, and the air outlet temperature sensor 210*d* are compared with an optimal temperature included in a predicted value table stored in the storage unit 330 in advance will be described as an example of the determination processing of the determination unit 310.

Figure 3:
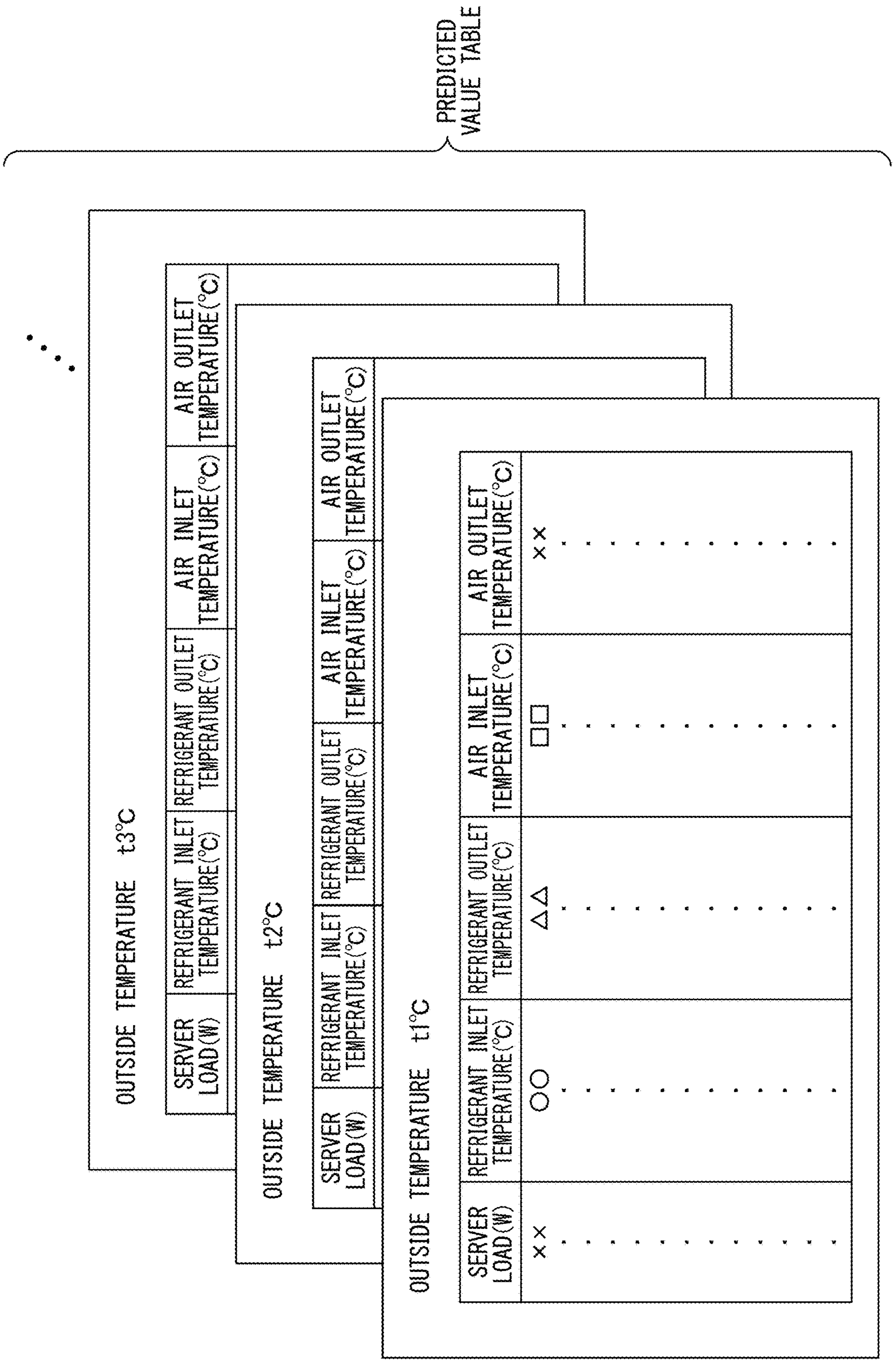
FIG. 3 is a diagram showing a predicted value table according to the first embodiment of the present disclosure.

Here, the predicted value table stored in the storage unit 330 will be described. As shown in FIG. 3, the predicted value table has, for each outside temperature value, a plurality of combinations of an outside temperature, a plurality of server loads, a refrigerant inlet temperature, a refrigerant outlet temperature, an air inlet temperature, and an air outlet temperature corresponding to the outside temperature and each of the server loads.

These refrigerant inlet temperature, refrigerant outlet temperature, air inlet temperature, and air outlet temperature are temperatures shown when the fan motor 212*c* and the pump motor 230*b* are driven under an operation condition obtained by inputting an outside temperature and a server load to correspondence information such as functions obtained based on past results, and the like. An example of the operating condition is a rotation speed (rpm), or the like. Hereinafter, for convenience of description, a refrigerant inlet temperature, a refrigerant outlet temperature, an air inlet temperature, and an air outlet temperature corresponding to an outside temperature and each of server loads will be collectively referred to as an "optimal temperature".

The determination unit 310 receives, from the acquisition unit 300, an outside temperature, a server load, the temperature of the second refrigerant R2 in the high temperature line 221, the temperature of the second refrigerant R2 in the low temperature line 222, the temperature of the air A before heat exchange in the dry cooler 210, and the temperature of the air A after heat exchange inside the dry cooler 210. When the determination unit 310 receives these temperatures, the determination unit 310 compares these temperatures with an optimal temperature corresponding to the outside temperature and the server load, and determines whether an abnormality has occurred in various pieces of equipment.

Specifically, the determination unit 310 compares the temperature of the second refrigerant R2 in the high temperature line 221 with the refrigerant inlet temperature in the predicted value table. In addition, the determination unit 310 compares the temperature of the second refrigerant R2 in the low temperature line 222 with the refrigerant outlet temperature in the predicted value table. Further, the determination unit 310 compares the temperature of the air A before heat exchange in the dry cooler 210 with the air inlet temperature in the predicted value table. In addition, the determination unit 310 compares the temperature of the air A after heat exchange in the dry cooler 210 with the air outlet temperature in the predicted value table.

When the temperature of the second refrigerant R2 in the high temperature line 221 and the temperature of the second refrigerant R2 in the low temperature line 222 are higher than the optimal temperature, the determination unit 310 determines that "an abnormality has occurred in the circulation pump 230". On the other hand, when the temperature of the second refrigerant R2 in the high temperature line 221 and the temperature of the second refrigerant R2 in the low temperature line 222 are equal to or lower than the optimal temperature, the determination unit 310 determines that "no abnormality has occurred in the circulation pump 230".

In addition, when the temperature of the air A after heat exchange in the dry cooler 210 is higher than the optimal temperature, the determination unit 310 determines that "an abnormality has occurred in the fan 212". On the other hand, when the temperature of the air A after heat exchange in the dry cooler 210 is equal to or lower than the optimal temperature, the determination unit 310 determines that "no abnormality has occurred in the fan 212".

(Warning Unit)

When the determination unit 310 determines that "an abnormality has occurred in the circulation pump 230", the warning unit 320 transmits a signal indicating that an abnormality has occurred in the circulation pump 230 to an output interface (not shown) for displaying the state of equipment used by the user of the monitoring device 30. In other words, the warning unit 320 transmits an alarm indicating an abnormality of the circulation pump 230 to the output interface. In addition, when the determination unit 310 determines that "an abnormality has occurred in the fan 212", the warning unit 320 transmits a signal indicating that an abnormality has occurred in the fan 212 to the output interface. In other words, the warning unit 320 outputs an alarm indicating an abnormality of the fan 212 to the output interface.

Examples of the output interface may include a terminal device such as a smartphone, a tablet, or a monitor disposed outside the cooling device 20. When the output interface receives a signal indicating that an abnormality has occurred in the circulation pump 230 from the warning unit 320, an alarm indicating a warning is displayed for the user. The output interface may be a speaker or the like.

Here, the users in this embodiment can be divided into, for example, a maintenance staff and a supervisor. The maintenance staff and the supervisor each use the above-mentioned output interface.

When the maintenance staff confirms the alarm transmitted from the warning unit 320 through the output interface, he or she repairs the equipment having the abnormality indicated by the alarm. On the other hand, when the supervisor confirms the warning transmitted from the warning unit 320 through the output interface, he or she confirms an abnormality mode of the equipment having the abnormality indicated by the warning, and instructs (guides) the maintenance staff, for example, on a specific operation for the equipment corresponding to the abnormality mode.

(Operation of Monitoring Device)

Figure 4:
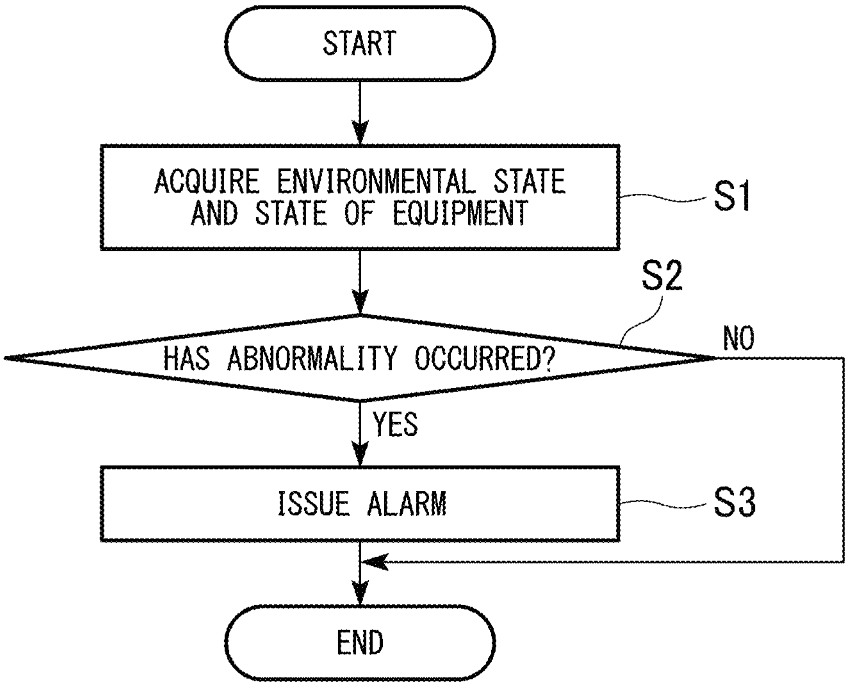
FIG. 4 is a flowchart showing operations of the monitoring device according to the first embodiment of the present disclosure.

Next, an example of the operation of the monitoring device 30 in this embodiment will be described with reference to FIG. 4.

The acquisition unit 300 acquires environmental state data around the cooling device 20 and state data of various pieces of equipment included in the cooling device 20 (step S1). Specifically, the acquisition unit 300 acquires an outside temperature, a server load, the temperature of the second refrigerant R2 in the high temperature line 221, the temperature of the second refrigerant R2 in the low temperature line 222, the temperature of air A before heat exchange in the dry cooler 210, and the temperature of the air A after the heat exchange in the dry cooler 210.

Next, the determination unit 310 determines whether an abnormality has occurred in the various pieces of equipment (step S2). Specifically, the determination unit 310 compares the temperatures acquired by the acquisition unit 300 with an optimal temperature corresponding to each of the outside temperature and the server load which are acquired by the acquisition unit 300, and determines whether an abnormality has occurred in various pieces of equipment.

When the determination unit 310 determines that no abnormality has occurred in the various pieces of equipment (step S2: NO), that is, when the determination unit 310 determines that "no abnormality has occurred in the circulation pump 230" and "no abnormality has occurred in the fan 212", the monitoring device 30 ends the processing. On the other hand, when the determination unit 310 determines that an abnormality has occurred in the various pieces of equipment (step S2: YES), that is, the determination unit 310 determines either one or both that "an abnormality has occurred in the circulation pump 230" and that "an abnormality has occurred in the fan 212", the warning unit 320 transmits an alarm to the output interface used by the user (step S3).

The processes from step S1 to step S3 described above are repeatedly executed during an operation stage of the cooling system 1.

(Operations of User)

Figure 5:
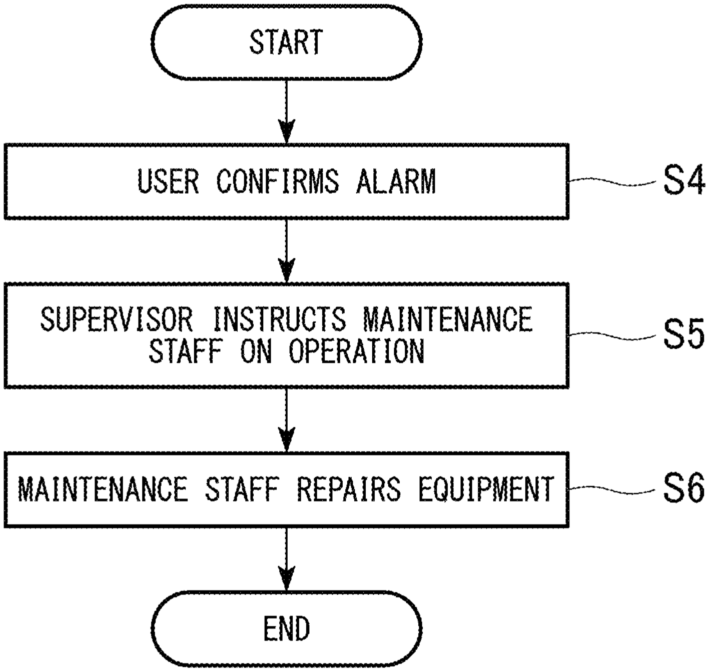
FIG. 5 is a flowchart showing a user's operations according to the first embodiment of the present disclosure.

Next, an example of a user's operations in this embodiment will be described with reference to FIG. 5.

When the warning unit 320 in the monitoring device 30 issues an alarm, a maintenance staff and a supervisor who are users confirms the alarm through the output interface (step S4). Next, the supervisor instructs the maintenance staff on an operation for the equipment corresponding to the abnormality mode (step S5). The maintenance staff repairs the equipment having the abnormality after receiving the instruction from the supervisor (step S6).

The processes from step S4 to step S6 described above are repeatedly executed during an operation stage of the cooling system 1.

(Actions and Effects)

According to the monitoring device 30 described above, each of the actual temperatures of the second refrigerant R2 before and after heat exchange and the actual temperatures of air A before and after the heat exchange is compared with an optimal temperature. Thereby, the actual heat exchange efficiency of a heat medium in the dry cooler 210 can be reflected in determination of whether an abnormality has occurred in each of the fan 212 and the circulation pump 230. Thus, for example, as compared to a case where the actual temperatures of the heat medium before and after heat exchange in the cooling device 20 are not used for determining whether an abnormality has occurred in the equipment, it is possible to ascertain a decrease in the heat exchange performance of the entire cooling device 20 at an early stage and to perform maintenance on the fan 212 and circulation pump 230 at a more appropriate timing. As a result, it is possible to further stabilize the state of the heat medium while the cooling system 1 is in operation.

Further, the determination unit 310 of the monitoring device 30 described above determines that an abnormality has occurred in the circulation pump 230 when the temperature of the second refrigerant R2 flowing into the heat exchanger 213 and the temperature of the second refrigerant R2 flowing out of the heat exchanger 213 are higher than an optimal temperature. Thereby, it is possible to detect an abnormality in the circulation pump 230 at an early stage and take measures such as repair. Thus, it is possible to further stabilize the state of the second refrigerant R2 while the cooling system 1 is in operation.

In addition, the determination unit 310 of the monitoring device 30 described above determines that an abnormality has occurred in the fan 212 when the temperature of the second refrigerant R2 flowing out of the heat exchanger 213 is higher than the optimal temperature. Thereby, it is possible to detect an abnormality of the fan 212 at an early stage and take measures such as repairs. Thus, it is possible to further stabilize the state of the second refrigerant R2 while the cooling system 1 is in operation.

Second Embodiment

Next, a configuration of a monitoring device 30 of a cooling system 1 according to a second embodiment of the present disclosure will be described. The second embodiment is different from the first embodiment in a configuration of a cooling device 20 and some of functions and operations of functional units of the monitoring device 30. The same parts as those in the first embodiment will be described with the same reference numerals, and repeated description will be omitted.

(Cooling System)

Figure 6:
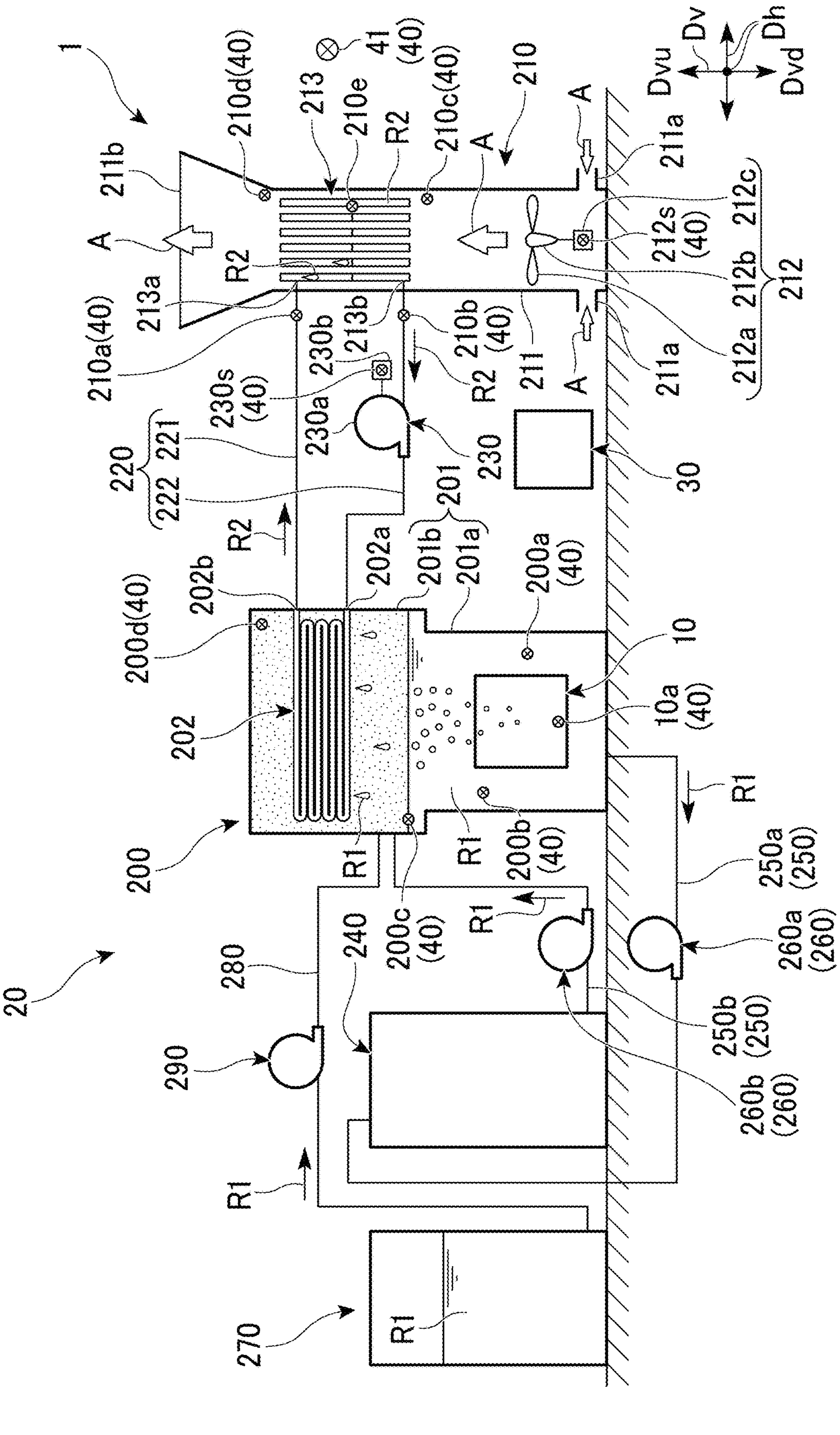
FIG. 6 is a diagram showing a configuration of a cooling system according to a second embodiment of the present disclosure.

As shown in FIG. 6, the cooling device 20 in this embodiment includes a refrigerant tank 200, a dry cooler 210, a second refrigerant line 220, a circulation pump 230, a purification device 240, a refrigerant purification line 250, a purification pump 260, a separate tank 270, a refrigerant replenishing line 280, and a replenishing pump 290. The refrigerant tank 200, the dry cooler 210, the second refrigerant line 220, and the circulation pump 230 have the same configurations as those in the first embodiment.

(Purification Device)

The purification device 240 accommodates a first refrigerant R1 in a liquid state independently of the refrigerant tank 200. The first refrigerant R1 is supplied to the purification device 240 from the outside. The purification device 240 recovers impurities from the supplied first refrigerant R1 using an electromagnetic force or the like and supplies the first refrigerant R1 from which the impurities have been removed to the outside. The purification device 240 is disposed to be separated from the refrigerant tank 200 in the horizontal direction Dh.

(Refrigerant Purification Line)

The refrigerant purification line 250 is a tube capable of making the first refrigerant R1 flow back and forth between the refrigerant tank 200 and the purification device 240. The refrigerant purification line 250 includes a first purification line 250*a* in which the first refrigerant R1 in a liquid state within a refrigerant tank main body 201 flows from the refrigerant tank 200 side toward the purification device 240 side, and a second purification line 250*b* in which the first refrigerant R1 in the purification device 240 flows from the purification device 240 side toward the refrigerant tank 200 side.

The first purification line 250*a* connects a portion of a downward side Dvd in the first tank 201*a* of the refrigerant tank main body 201 and a portion of an upward side Dvu in the purification device 240. The second purification line 250*b* connects a portion of a downward side Dvd in the purification device 240 and a second tank 201*b* in the refrigerant tank main body 201. Thus, the first refrigerant R1 flowing through the second purification line 250*b* has purity higher than that of the first refrigerant R1 flowing through the first purification line 250*a*. That is, the first refrigerant R1 flowing through the second purification line 250*b* contains less impurities than the first refrigerant R1 flowing through the first purification line 250*a*. The first purification line 250*a* and the second purification line 250*b* are made of a metal or the like.

(Purification Pump)

The purification pump 260 is a pump that circulates the first refrigerant R1 between the refrigerant tank 200 and the purification device 240 through the refrigerant purification line 250. The purification pump 260 in this embodiment includes, for example, a first pump 260*a* disposed in the middle of the first purification line 250*a* and a second pump 260*b* provided in the middle of the second purification line 250*b*.

The first pump 260*a* is driven to pressure-feed the first refrigerant R1 in the first purification line 250*a* from the refrigerant tank 200 side toward the purification device 240 side. The second pump 260*b* is driven to pressure-feed the first refrigerant R1 in the second purification line 250*b* from the purification device 240 side toward the refrigerant tank 200 side. Thereby, the first refrigerant R1 in a liquid state within the refrigerant tank main body 201 is circulated in the order of the first tank 201*a*, the first purification line 250*a*, the purification device 240, the second purification line 250*b*, and the second tank 201*b*.

Thus, impurities are removed from the first refrigerant R1 in the refrigerant tank main body 201 by driving the purification pump 260. That is, the first refrigerant R1 in the refrigerant tank main body 201 is purified by driving the purification pump 260.

In this embodiment, the starting and stopping of the first pump 260*a* and the second pump 260*b*, and a rated rotation speed (a flow rate of the first refrigerant R1 flowing through the first purification line 250*a* and the second purification line 250*b*) are controlled by the monitoring device 30. Specifically, the first pump 260*a* and the second pump 260*b* receive a signal indicating a start instruction, a signal indicating a stop instruction, and a signal indicating an output rotation speed from the monitoring device 30 through wired or wireless communication.

In other words, the first pump 260*a* and the second pump 260*b* rotate based on the rotation speed indicated by the signal, and pressure-feed the first refrigerant R1 between the refrigerant tank 200 and the purification device 240. In addition, the first pump 260*a* and the second pump 260*b* transmit a signal indicating its own output rotation speed to the monitoring device 30 through wired or wireless communication at a predetermined timing.

(Separate Tank)

The separate tank 270 is a tank that accommodates the first refrigerant R1 in a liquid state independently of the refrigerant tank 200 and the purification device 240. The separate tank 270 is disposed to be spaced apart from the refrigerant tank 200 and the purification device 240 in the horizontal direction Dh.

(Refrigerant Replenishing Line)

The refrigerant replenishing line 280 is a tube capable of allowing the first refrigerant R1 accommodated in the separate tank 270 to be supplied to the refrigerant tank 200. The refrigerant replenishing line 280 in this embodiment connects, for example, a portion of a downward side Dvd in the separate tank 270 and the second tank 201*b* of the refrigerant tank main body 201. The refrigerant replenishing line 280 is made of a metal or the like.

(Replenishing Pump)

The replenishing pump 290 is a pump capable of allowing the first refrigerant R1 to be supplied from the separate tank 270 to the refrigerant tank 200 through the refrigerant replenishing line 280. The replenishing pump 290 is driven to pressure-feed the first refrigerant R1 in the refrigerant replenishing line 280 from the separate tank 270 side to the refrigerant tank 200 side. Thus, the first refrigerant R1 in the refrigerant tank main body 201 is replenished with the first refrigerant R1 in the separate tank 270 by driving the replenishing pump 290.

In this embodiment, the starting and stopping of the replenishing pump 290 and a rated rotation speed (a flow rate of the first refrigerant R1 flowing through the refrigerant replenishing line 280) are controlled by the monitoring device 30. Specifically, the replenishing pump 290 receives a signal indicating a start instruction, a signal indicating a stop instruction, and a signal indicating an output rotation speed from the monitoring device 30 through wired or wireless communication.

(Monitoring Device)

Figure 7:
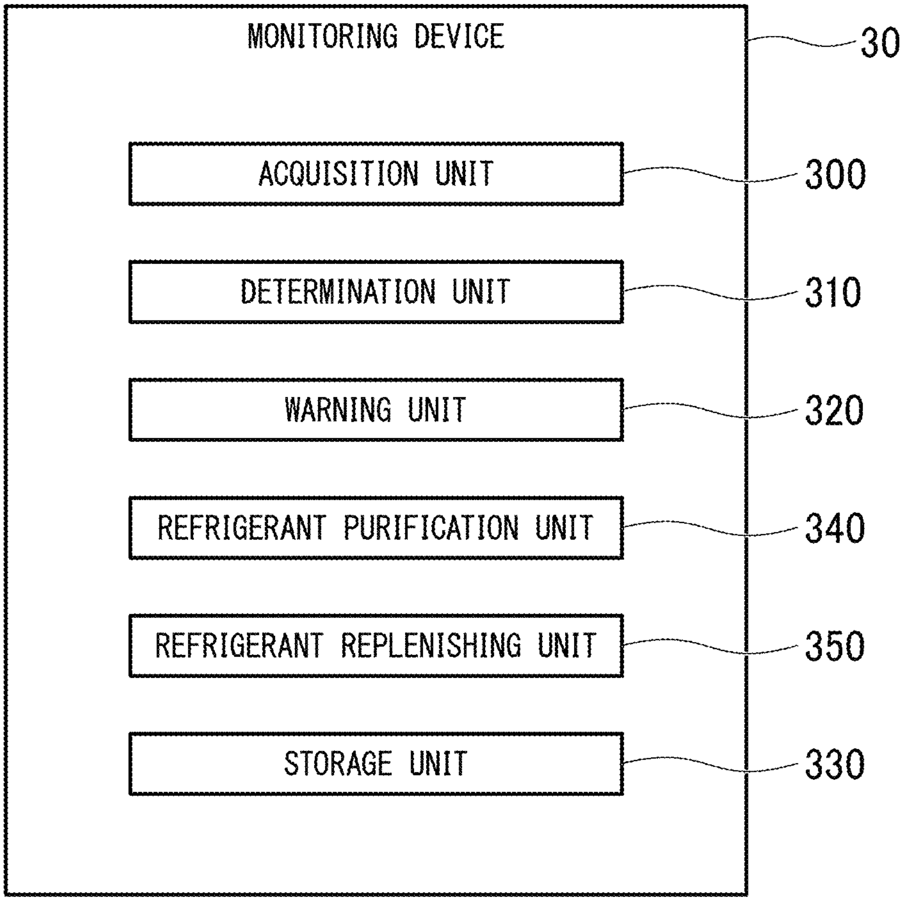
FIG. 7 is a functional block diagram of a monitoring device according to the second embodiment of the present disclosure.

As shown in FIG. 7, the monitoring device 30 includes an acquisition unit 300, a determination unit 310, a warning unit 320, a refrigerant purification unit 340, a refrigerant replenishing unit 350, and a storage unit 330. The acquisition unit 300 has the same configuration as that in the first embodiment.

(Determination Unit)

The determination unit 310 performs determination processing based on environmental state data around the cooling device 20 and state data of various pieces of equipment included in the cooling device 20 which are received from the acquisition unit 300, and various predetermined values stored in the storage unit 330 in advance. In this embodiment, a case where various pieces of data received from a conductivity sensor 200*a* and a first liquid level sensor 200*c* are compared with predetermined threshold values stored in the storage unit 330 in advance will be described as an example of the determination processing of the determination unit 310.

The determination unit 310 receives a conductivity of the first refrigerant R1 in a liquid state within the refrigerant tank main body 201 and a liquid level of the first refrigerant R1 in the refrigerant tank main body 201 from the acquisition unit 300. When these are received, the determination unit 310 compares these with predetermined threshold values stored in the storage unit 330, and determines whether an abnormality has occurred in the first refrigerant R1 in the refrigerant tank 200 and the refrigerant tank main body 201.

Specifically, the determination unit 310 compares the conductivity of the first refrigerant R1 in the refrigerant tank main body 201 with a first threshold value indicating the conductivity stored in the storage unit 330. When the conductivity of the first refrigerant R1 is higher than the first threshold value, the determination unit 310 determines that "an abnormality has occurred in the first refrigerant R1 in the refrigerant tank main body 201". On the other hand, when the conductivity of the first refrigerant R1 is equal to or lower than the first threshold value, the determination unit 310 determines that "no abnormality has occurred in the first refrigerant R1 in the refrigerant tank main body 201".

In addition, the determination unit 310 compares the liquid level of the first refrigerant R1 in the refrigerant tank main body 201 with a second threshold value indicating the liquid level of the first refrigerant R1 stored in the storage unit 330. When the liquid level of the first refrigerant R1 is lower than the second threshold, the determination unit 310 determines that "the first refrigerant R1 is leaking from the refrigerant tank 200". On the other hand, when the liquid level is equal to or higher than the second threshold value, the determination unit 310 determines that "the first refrigerant R1 is not leaking from the refrigerant tank 200".

(Warning Unit)

When the determination unit 310 determines that "an abnormality has occurred in the first refrigerant R1 in the refrigerant tank main body 201", the warning unit 320 transmits a signal indicating that an abnormality has occurred in the first refrigerant R1 to an output interface. That is, the warning unit 320 transmits an alarm indicating the abnormality of the first refrigerant R1 to the output interface used by a user.

(Refrigerant Purification Unit)

When the determination unit 310 determines that "an abnormality has occurred in the first refrigerant R1 in the refrigerant tank main body 201", the refrigerant purification unit 340 drives the purification pump 260. Specifically, the refrigerant purification unit 340 drives the purification pump 260 by transmitting a signal indicating a start instruction to the purification pump 260. Here, when the refrigerant purification unit 340 drives the purification pump 260, the determination unit 310 determines that "the refrigerant is being purified". Furthermore, when the refrigerant purification unit 340 is not driving the purification pump 260, the determination unit 310 determines that "the refrigerant is not being purified".

(Refrigerant Replenishing Unit)

The refrigerant replenishing unit 350 drives the replenishing pump 290 when the determination unit 310 determines that "the refrigerant is being purified" and that "the first refrigerant R1 is leaking from the refrigerant tank 200". Specifically, the refrigerant replenishing unit 350 drives the replenishing pump 290 by transmitting a signal indicating a start instruction to the replenishing pump 290.

(Operations of Monitoring Device)

Figure 8:
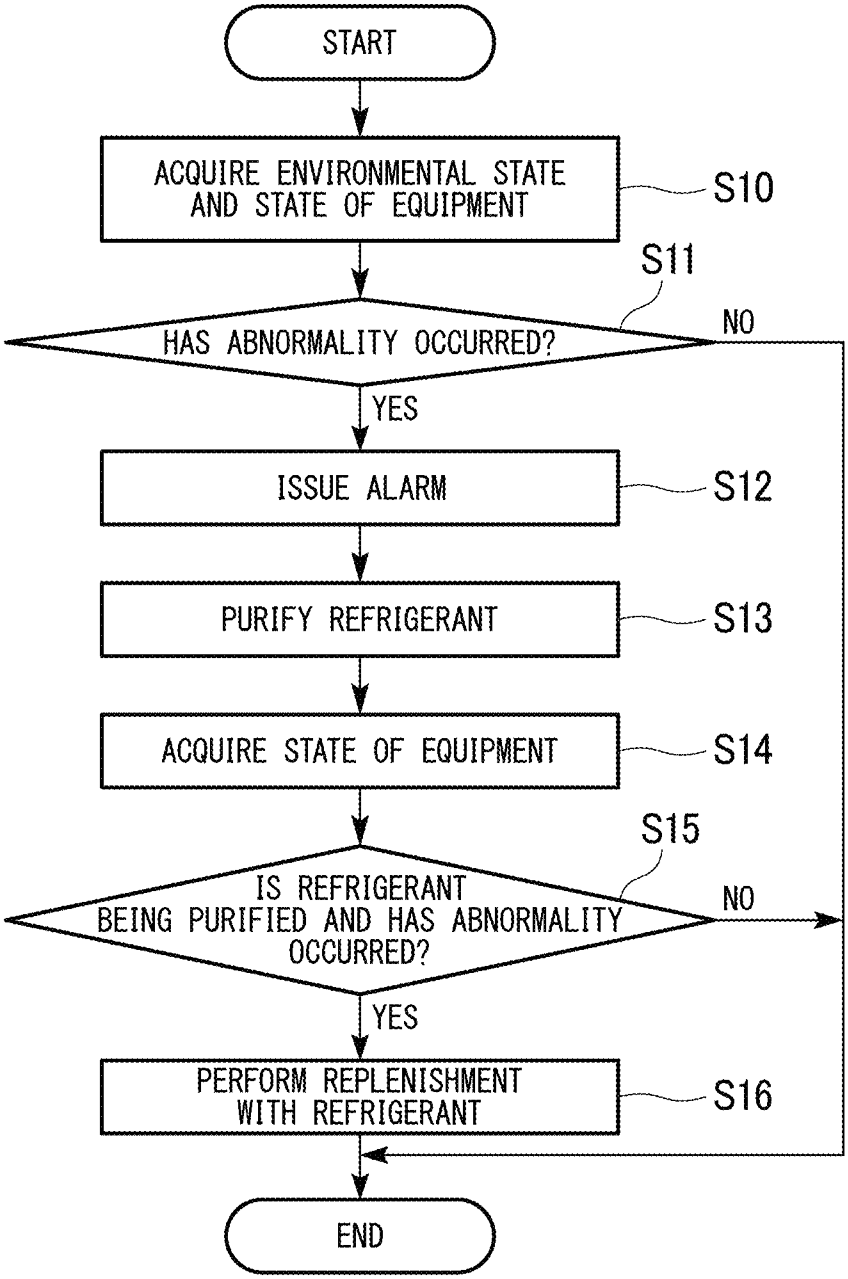
FIG. 8 is a flowchart showing operations of the monitoring device according to the second embodiment of the present disclosure.

Next, an example of operations of the monitoring device 30 in this embodiment will be described with reference to FIG. 8.

The acquisition unit 300 acquires environmental state data around the cooling device 20 and state data of various pieces of equipment included in the cooling device 20 (step S10). Specifically, the acquisition unit 300 acquires a conductivity of the first refrigerant R1 in a liquid state within the refrigerant tank main body 201 and a liquid level of the first refrigerant R1 in the refrigerant tank main body 201.

Next, the determination unit 310 determines whether an abnormality has occurred in the equipment (step S11). Specifically, the determination unit 310 compares the conductivity of the first refrigerant R1 in the refrigerant tank main body 201 with a first threshold value indicating the conductivity stored in the storage unit 330 to determine whether an abnormality has occurred in the first refrigerant R1 in the refrigerant tank main body 201.

When the determination unit 310 determines that no abnormality has occurred in the equipment (step S11: NO), that is, when the determination unit 310 determines that "no abnormality has occurred in the first refrigerant R1 in the refrigerant tank main body 201", the monitoring device 30 ends the processing. On the other hand, when the determination unit 310 determines that an abnormality has occurred in the equipment (step S11: YES), that is, when the determination unit 310 determines that "an abnormality has occurred in the first refrigerant R1 in the refrigerant tank main body 201", the warning unit 320 transmits an alarm to the output interface used by the user (step S12).

Next, the refrigerant purification unit 340 drives the purification pump 260 (step S13). Next, the acquisition unit 300 acquires the state data of the equipment included in the cooling device 20 (step S14). Specifically, the acquisition unit 300 acquires the liquid level of the first refrigerant R1 in the liquid state within the refrigerant tank main body 201.

Next, the determination unit 310 determines whether the refrigerant is being purified and an abnormality has occurred in the equipment (step S15). Specifically, when the refrigerant is being purified, the determination unit 310 compares the liquid level of the first refrigerant R1 in a liquid state within the refrigerant tank main body 201 with a second threshold value indicating the liquid level of the first refrigerant R1 stored in the storage unit 330, and determines whether the first refrigerant R1 is leaking from the refrigerant tank main body 201.

When the determination unit 310 determines that "the refrigerant is not being purified", or when the determination unit 310 determines that "the refrigerant is being purified" and "the first refrigerant R1 is not leaking from the refrigerant tank 200" (step S15: NO), the monitoring device 30 ends the processing. On the other hand, when the determination unit 310 determines that "the refrigerant is being purified" and "the refrigerant is leaking from the refrigerant tank 200" (step S15: YES), the refrigerant replenishing unit 350 drives the replenishing pump 290 (step S16).

The processes from step S10 to step S16 described above are repeatedly executed during an operation stage of the cooling system 1.

(Actions and Effects)

According to the monitoring device 30 described above, the purification pump 260 is driven based on the conductivity of the first refrigerant R1 in the refrigerant tank 200 to purify the first refrigerant R1 in the refrigerant tank 200. That is, impurities in the first refrigerant R1 are removed. Thereby, it is possible to prevent electrical leakage from the server 10 due to the influence of the impurities in the first refrigerant R1. Thus, it is possible to further stabilize the state of the first refrigerant R1 in the refrigerant tank 200 while the cooling system 1 is in operation. In addition, even when the conductivity of the first refrigerant R1 in the refrigerant tank 200 increases, it is not necessary to stop the operation of the cooling device 20.

In addition, the determination unit 310 of the monitoring device 30 described above compares the liquid level of the first refrigerant R1 in the refrigerant tank main body 201 with the second threshold value, and determines that the first refrigerant R1 is leaking from the refrigerant tank 200 when the liquid level is lower than the second threshold value. Thereby, it is possible to detect an abnormality of the refrigerant tank 200 at an early stage and take measures such as repair.

In addition, the monitoring device 30 described above drives the replenishing pump 290 to replenish the refrigerant tank 200 with the first refrigerant R1 when the liquid level of the first refrigerant R1 is lower than the second threshold value. Thereby, it is possible to suppress a decrease in the efficiency of heat exchange between the server 10 and the first refrigerant R1 and a decrease in the efficiency of heat exchange between the first refrigerant R1 and the second refrigerant R2. As a result, it is possible to further stabilize the state of a heat medium during operation of the cooling system 1. Further, even when the liquid level of the first refrigerant R1 in the refrigerant tank 200 is lowered, it is not necessary to stop the operation of the cooling device 20.

Other Embodiments

Although the embodiments of the present disclosure have been described above in detail with reference to the drawings, the specific configurations are not limited to the configurations of the embodiments, and addition, omission, substitution, and other changes can be made to configurations without departing from the scope of the present disclosure.

Figure 9:
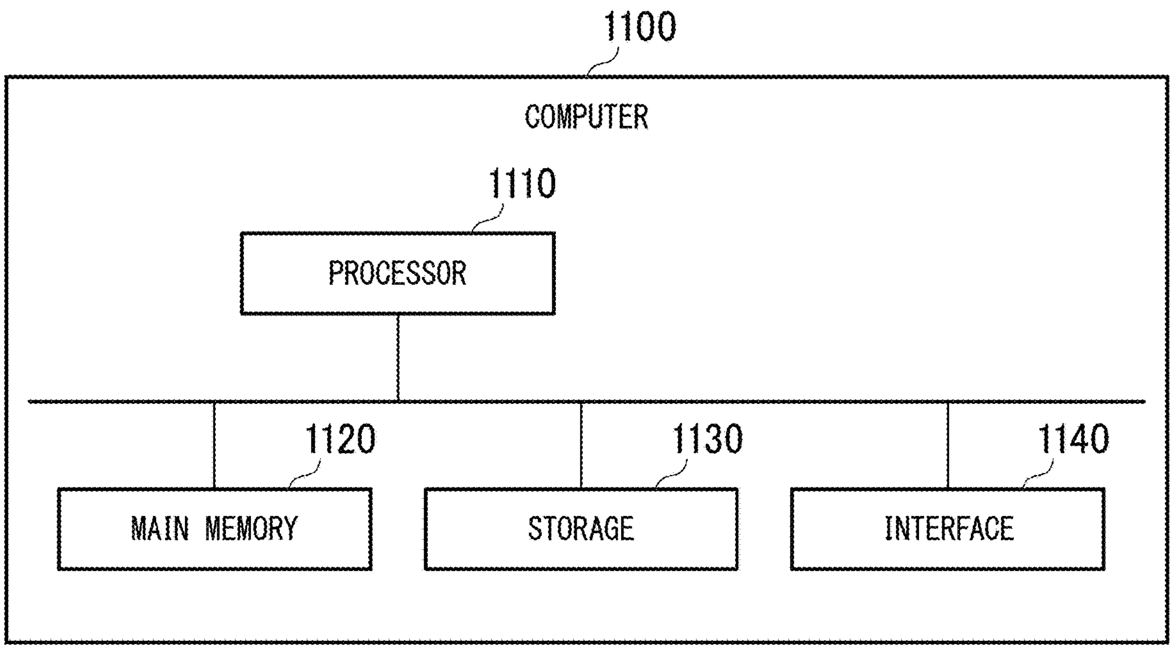
FIG. 9 is a hardware configuration diagram showing a configuration of a computer according to an embodiment of the present disclosure.

FIG. 9 is a hardware configuration diagram showing a configuration of a computer 1100 according to this embodiment. The computer 1100 includes a processor 1110, a main memory 1120, a storage 1130, and an interface 1140.

The monitoring device 30 described above is mounted on the computer 1100. The operation of each of the processing units described above is stored in the storage 1130 in the form of a program. The processor 1110 reads the program from the storage 1130, loads it into the main memory 1120, and executes the above-described processing in accordance with the program. Further, the processor 1110 secures a storage area corresponding to the storage unit 330 described above in the main memory 1120 in accordance with the program.

The program may be intended to realize some of the functions that are executed by the computer 1100. For example, the program may execute a function in combination with another program already stored in the storage 1130 or in combination with another program installed in another device.

Further, the computer 1100 may include a custom large scale integrated circuit (LSI) such as a programmable logic device (PLD) in addition to or instead of the above configuration. Examples of the PLD include a programmable array logic (PAL), a generic array logic (GAL), a complex programmable logic device (CPLD), and a field programmable gate array (FPGA). In this case, some or all of the functions realized by the processor 1110 may be realized by the integrated circuit.

Examples of the storage 1130 include a magnetic disk, a magneto-optical disk, a semiconductor memory, and the like. The storage 1130 may be internal media connected directly to a bus of the computer 1100, or may be external media connected to the computer 1100 via the interface 1140 or a communication line. Further, when this program is distributed to the computer 1100 via a communication line, the computer 1100 that has received the distribution may load the program into the main memory 1120 and execute the above processing. In the embodiments described above, the storage 1130 is a non-transitory tangible storage medium.

Additionally, the program may be for realizing some of the functions described above. Furthermore, the program may be a so-called difference file (difference program) that realizes the above-described functions in combination with other programs already stored in the storage 1130.

In addition, in the above embodiment, the configuration in which the circulation pump 230 is disposed in the middle of the low temperature line 222 in the second refrigerant line 220 has been described, but the configuration is not limited to this. The circulation pump 230 may be disposed in the middle of the high temperature line 221 in the second refrigerant line 220.

Furthermore, in the above embodiment, a case where the storage unit 330 stores the predicted value table, the first threshold value, and the second threshold value has been described, but the present disclosure is not limited thereto. Instead of the configuration stored in the storage unit 330, the determination unit 310 may store the predicted value table, the first threshold value, and the second threshold value.

Furthermore, in the first embodiment, a case where the determination unit 310 determines whether an abnormality has occurred in the circulation pump 230 and whether an abnormality has occurred in the fan 212 has been described, but the present disclosure is not limited thereto, and the determination unit 310 may determine whether an abnormality has occurred in only one of them.

Figure 10:
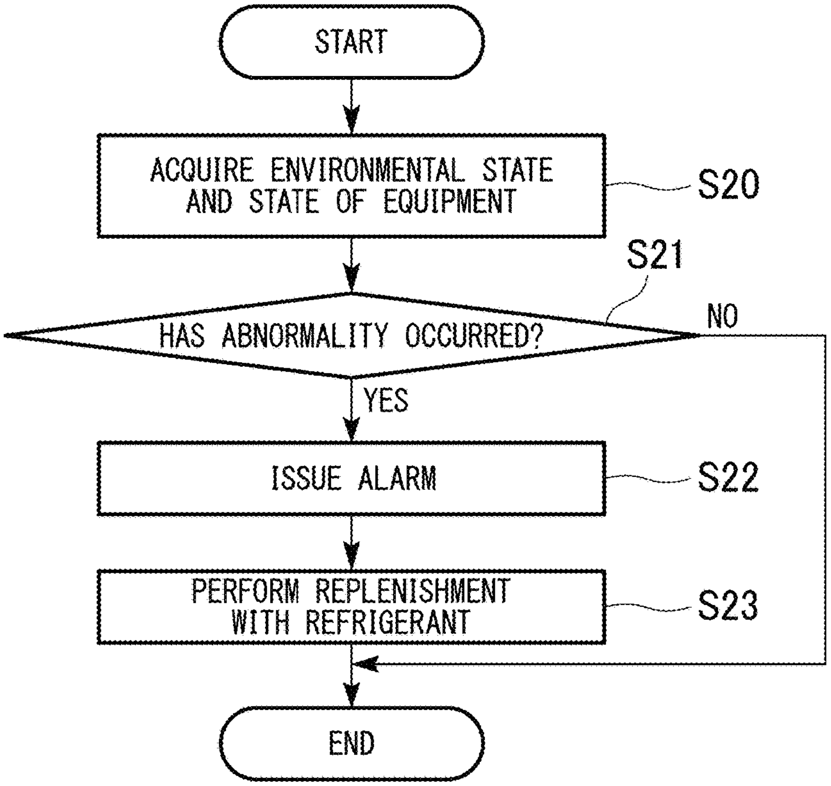
FIG. 10 is a flowchart showing operations of a monitoring device according to another embodiment of the present disclosure.

Further, in the second embodiment, when the determination unit 310 determines that "the refrigerant is being purified" and that "the first refrigerant R1 is leaking from the refrigerant tank 200", the refrigerant replenishing unit 350 drives the replenishing pump 290, but the present disclosure is not limited thereto. For example, the refrigerant replenishing unit 350 may drive the replenishing pump 290 when the determination unit 310 determines that "the first refrigerant R1 is leaking from the refrigerant tank 200". At this time, the monitoring device 30 may not include the refrigerant purification unit 340. Hereinafter, a modification example of the operation of the monitoring device 30 in this case will be described with reference to FIG. 10.

The acquisition unit 300 acquires environmental state data around the cooling device 20 and state data of various pieces of equipment included in the cooling device 20 (step S20). Specifically, the acquisition unit 300 acquires the liquid level of the first refrigerant R1 in a liquid state within the refrigerant tank main body 201. Next, the determination unit 310 determines whether an abnormality has occurred in the equipment (step S21). Specifically, the determination unit 310 compares the liquid level of the first refrigerant R1 in a liquid state within the refrigerant tank main body 201 with a second threshold value indicating the liquid level of the first refrigerant R1 stored in the storage unit 330, and determines whether the first refrigerant R1 is leaking from the refrigerant tank main body 201.

When the determination unit 310 determines that "the first refrigerant R1 is not leaking from the refrigerant tank 200" (step S21: NO), the monitoring device 30 ends the processing. On the other hand, when the determination unit 310 determines that "the refrigerant is leaking from the refrigerant tank 200" (step S21: YES), the warning unit 320 transmits an alarm to the output interface used by the user (step S22). Next, the refrigerant replenishing unit 350 drives the replenishing pump 290 (step S23). The processes from step S20 to step S23 described above are repeatedly executed during an operation stage of the cooling system 1.

Further, the determination unit 310 of the monitoring device 30 may determine whether an abnormality has occurred in at least one of the fan 212 and the circulation pump 230 by comparing a current value flowing through the fan motor 212*c* and a current value flowing through the pump motor 230*b* which are acquired by the acquisition unit 300 with a threshold value indicating a predetermined current value stored in the storage unit 330 in advance. Specifically, when the current flowing through the fan motor 212*c* is larger than the above-mentioned threshold value, the determination unit 310 determines that, for example, "an abnormality has occurred in the blade 212*a* of the fan 212". Furthermore, when the current flowing through the pump motor 230*b* is larger than the above-mentioned threshold value, the determination unit 310 determines that, for example, "an abnormality has occurred in the impeller of the circulation pump 230". At this time, the determination unit 310 may perform the above-mentioned determination processing in step S2 while the monitoring device 30 is in operation.

Further, for determination of whether the first refrigerant R1 is leaking from the refrigerant tank 200 in the determination unit 310, data on the atmospheric pressure inside the refrigerant tank main body 201 which is acquired by the acquisition unit 300 from the internal pressure sensor 200*d* may be used. For example, when the liquid level of the first refrigerant R1 is equal to or lower than the second threshold value and the atmospheric pressure within the refrigerant tank main body 201 is equal to or lower than a third threshold value stored in the storage unit 330, the determination unit 310 may determine that "the first refrigerant R1 is leaking from the refrigerant tank 200". That is, processing may be adopted in which it is determined that the first refrigerant R1 is leaking from the refrigerant tank 200 when it is possible to confirm a tendency such as the atmospheric pressure inside the refrigerant tank main body 201 not increasing in spite of a decrease in the liquid level of the first refrigerant R1 in a liquid state within the refrigerant tank main body 201.

Further, after a maintenance staff ends repair of the equipment, at least one of the maintenance staff and a supervisor may, for example, record (store) environmental state data around the cooling device 20, state data of various pieces of equipment included in the cooling device 20, and a failure mode, which are acquired by the acquisition unit 300 at the time of a failure of the equipment, in the storage unit 330 included in the monitoring device 30 to create a database. The user may record these in a host device or the like via an input interface or the like and create a database.

Hereinafter, a combination of environmental state data around the cooling device 20, state data of various pieces of equipment included in the cooling device 20, and a failure mode will be referred to as a failure record. The determination unit 310 of the monitoring device 30 may adopt processing for determining whether an abnormality has occurred in various pieces of equipment by, for example, AI using machine learning (supervised learning) by using the failure record in a database as an input/output sample. At this time, the acquisition unit 300 in the monitoring device 30 acquires the failure record from the failure record database stored in the storage unit 330. Hereinafter, a modification example of the user's operations and the operations of the monitoring device 30 described in the above embodiment will be described with reference to FIGS. 11 and 12.

(User's Operations)

When the warning unit 320 of the monitoring device 30 issues an alarm, the maintenance staff and the supervisor who are the users confirm the alarm through the output interface (step S4). Next, the supervisor instructs the maintenance staff to operate the equipment corresponding to an abnormality mode (step S5). The maintenance staff repairs the equipment upon receiving the instruction from the supervisor (step S6). Next, at least one of the maintenance staff and the supervisor creates a database of failure records (step S7). The processes from step S4 to step S7 described above are repeatedly executed during an operation stage of the cooling system 1.

(Operations of Monitoring Device in Modification Example of First Embodiment)

Figure 11:
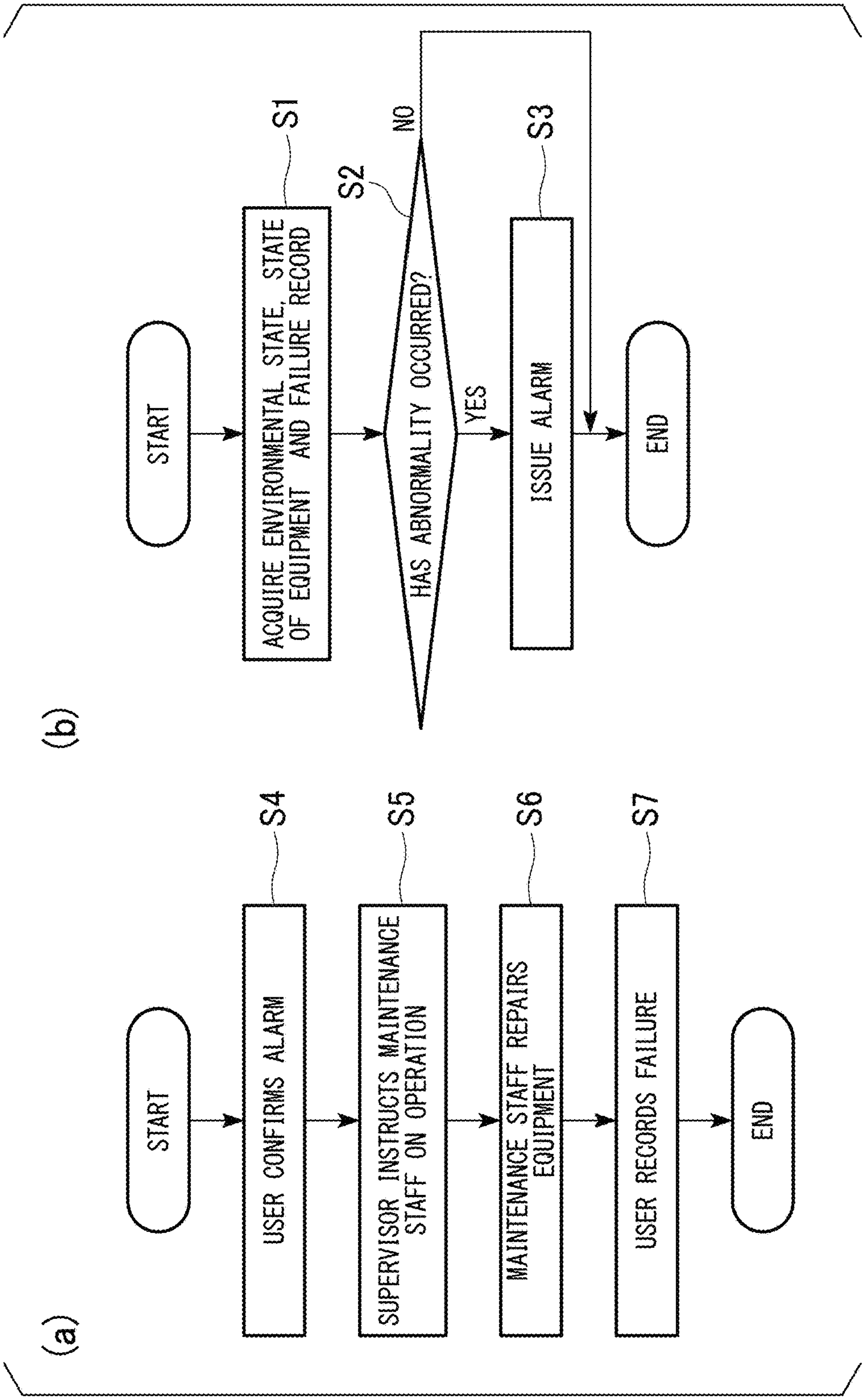
FIG. 11 is a flowchart showing a user's operations and operations of a monitoring device according to another embodiment of the present disclosure.

As shown in FIG. 11, the acquisition unit 300 acquires environmental state data around the cooling device 20, state data of various pieces of equipment included in the cooling device 20, and failure records (step S1). Next, the determination unit 310 determines whether an abnormality has occurred in various pieces of equipment (step S2). When the determination unit 310 determines that no abnormality has occurred in the various pieces of equipment (step S2: NO), the monitoring device 30 ends the processing. On the other hand, when the determination unit 310 determines that an abnormality has occurred in the various pieces of equipment (step S2: YES), the warning unit 320 transmits an alarm to an output interface used by a user (step S3). The processes from step S1 to step S3 are repeatedly executed during an operation stage of the cooling system 1.

(Operations of Monitoring Device in Modification Example of Second Embodiment)

Figure 12:
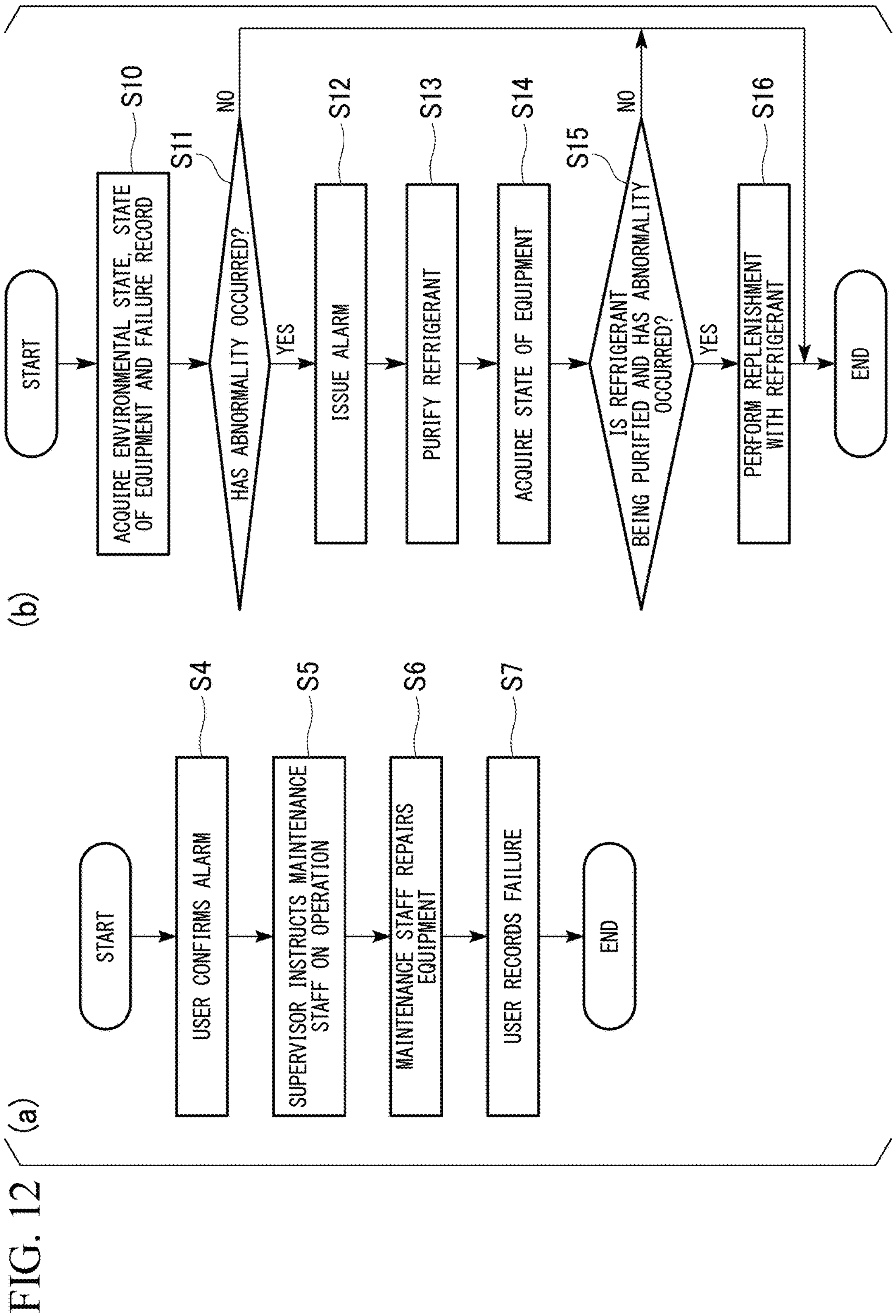
FIG. 12 is a flowchart showing a user's operations and operations of a monitoring device according to another embodiment of the present disclosure.

As shown in FIG. 12, the acquisition unit 300 acquires environmental state data around the cooling device 20, state data of various pieces of equipment included in the cooling device 20, and failure records (step S10). Next, the determination unit 310 determines whether an abnormality has occurred in the equipment (step S11). When the determination unit 310 determines that no abnormality has occurred in the equipment (step S11: NO), the monitoring device 30 ends the processing. On the other hand, when the determination unit 310 determines that an abnormality has occurred in the equipment (step S11: YES), the warning unit 320 transmits an alarm to an output interface used by a user (step S12).

Next, the refrigerant purification unit 340 drives the purification pump 260 (step S13). Next, the acquisition unit 300 acquires state data of equipment included in the cooling device 20 (step S14). Next, the determination unit 310 determines whether a refrigerant is being purified and an abnormality has occurred in the equipment (step S15). When the determination unit 310 determines that "the refrigerant is not being purified" or when the determination unit 310 determines that "the refrigerant is being purified" and "the first refrigerant R1 is not leaking from the refrigerant tank 200" (step S15: NO), the monitoring device 30 ends the processing. On the other hand, when the determination unit 310 determines that "the refrigerant is being purified" and "the refrigerant is leaking from the refrigerant tank 200" (step S15: YES), the refrigerant replenishing unit 350 drives the replenishing pump 290 (step S16). The processes from step S10 to step S16 described above are repeatedly executed during an operation stage of the cooling system 1.

Furthermore, the configurations of the cooling systems 1 described in the embodiments are not limited to independent configurations, and the components described in the embodiments may be combined as appropriate.

Appendices

The monitoring devices described in the embodiments are understood as follows, for example.

(1) A monitoring device 30 according to a first aspect monitors an abnormality of a cooling device 20, wherein the cooling device 20 includes a refrigerant tank 200 that accommodates a first refrigerant R1 for removing heat from electronic equipment in a closed space, a dry cooler 210 that cools a second refrigerant R2 that has exchanged heat with the first refrigerant R1 using air A outside the refrigerant tank 200, and a circulation pump 230 that causes the second refrigerant R2 to circulate between the refrigerant tank 200 and the dry cooler 210 through a second refrigerant line 220, the monitoring device 30 including an acquisition unit 300 that acquires at least one set of a set including a temperature of the second refrigerant R2 flowing into a heat exchanger 213 in the dry cooler 210 and a temperature of the second refrigerant R2 flowing out of the heat exchanger 213, and a set including a temperature of the air A flowing into the heat exchanger 213 and a temperature of the air flowing out of the heat exchanger 213, and a determination unit 310 that compares an optimal temperature corresponding to an outside temperature and a load of the electronic equipment with each of the temperatures acquired by the acquisition unit 300 to determine whether an abnormality has occurred in one or more of the dry cooler 210 and the circulation pump 230.

Thereby, at least one set one among the actual temperatures of the second refrigerant R2 before and after heat exchange and the actual temperatures of the air A before and after heat exchange are compared with an optimal temperature, and thus the actual heat exchange efficiency can be reflected in determination of whether an abnormality has occurred in each of the dry cooler 210 and the circulation pump 230 that handle a heat medium. Thus, for example, as compared to a case where the actual temperatures before and after heat exchange of the heat medium in the cooling device 20 are not used for determining whether an abnormality has occurred, it is possible to ascertain a decrease in the heat exchange performance of the entire cooling device 20 at an early stage and to perform maintenance on the equipment at a more appropriate timing.

(2) A monitoring device 30 according to a second aspect is the monitoring device 30 according to the first aspect, in which the determination unit 310 may determine that an abnormality has occurred in the circulation pump 230 when each of the temperature of the second refrigerant R2 flowing into the heat exchanger 213 and the temperature of the second refrigerant R2 flowing out of the heat exchanger 213 is higher than the optimal temperature, and may determine that an abnormality has occurred in the dry cooler 210 when the temperature of the second refrigerant R2 flowing out of the heat exchanger 213 is higher than the optimal temperature.

Thereby, it is possible to detect an abnormality in the equipment at an early stage and take measures such as repair.

(3) A monitoring device 30 according to a third aspect is the monitoring device 30 according to the first aspect or the second aspect, in which the cooling device 20 may further include a purification device 240 that accommodates the first refrigerant R1 independently of the refrigerant tank 200, and a purification pump 260 that is driven to allow the first refrigerant R1 in the refrigerant tank 200 and the first refrigerant R1 in the purification device 240 to be replaceable through a refrigerant purification line 250, the acquisition unit 300 may further acquire a conductivity of the first refrigerant R1 in the refrigerant tank 200, and the monitoring device 30 may further include a refrigerant purification unit 340 that drives the purification pump 260 based on the conductivity acquired by the acquisition unit 300.

Thereby, it is possible to prevent electrical leakage from the server 10 due to the influence of the impurities in the first refrigerant R1 within the refrigerant tank 200. In addition, it is not necessary to stop the cooling device 20.

(4) A monitoring device 30 according to a fourth aspect is the monitoring device 30 according to any one of the first to third aspects, in which the acquisition unit 300 further acquires a liquid level of the first refrigerant R1 in the refrigerant tank 200, and the determination unit 310 further determines whether the first refrigerant R1 is leaking from the refrigerant tank 200 based on the liquid level acquired by the acquisition unit 300.

Thereby, it is possible to detect an abnormality in the refrigerant tank 200 at an early stage and take measures such as repair.

(5) A monitoring device 30 according to the fifth aspect is the monitoring device 30 according to the fourth aspect, in which the cooling device 20 further includes a separate tank 270 that accommodates the first refrigerant R1 independently of the refrigerant tank 200, and a replenishing pump 290 that is driven to allow the first refrigerant R1 to be supplied from the separate tank 270 to the refrigerant tank 200 through a refrigerant replenishing line 280, and the monitoring device 30 further includes a refrigerant replenishing unit 350 that drives the replenishing pump 290 when the determination unit 310 determines that the first refrigerant R1 is leaking from the refrigerant tank 200.

Thereby, it is possible to suppress a decrease in the efficiency of heat exchange between the server 10 and the first refrigerant R1 and a decrease in the efficiency of heat exchange between the first refrigerant R1 and the second refrigerant R2. In addition, it is not necessary to stop the cooling device 20.

(6) A monitoring device 30 according to a sixth aspect monitors an abnormality of a cooling device 20, wherein the cooling device 20 includes a refrigerant tank 200 that accommodates a first refrigerant R1 for removing heat from electronic equipment in a closed space, a dry cooler 210 that cools a second refrigerant R2 that has exchanged heat with the first refrigerant R1 using air A outside the refrigerant tank 200, a separate tank 270 that accommodates the first refrigerant R1 independently of the refrigerant tank 200, and a replenishing pump 290 that is driven to allow the first refrigerant R1 to be supplied from the separate tank 270 to the refrigerant tank 200 through a refrigerant replenishing line 280, the monitoring device 30 including an acquisition unit 300 that acquires a liquid level of the first refrigerant R1 in the refrigerant tank 200, a determination unit 310 that determines whether the first refrigerant R1 is leaking from the refrigerant tank 200 based on the liquid level acquired by the acquisition unit 300, and a refrigerant replenishing unit 350 that drives the replenishing pump 290 when the determination unit 310 determines that the first refrigerant R1 is leaking from the refrigerant tank 200.

Thereby, when the first refrigerant R1 is leaking from the refrigerant tank 200, the replenishing pump 290 is driven and the refrigerant tank 200 is replenished with the first refrigerant R1, and thus it is possible to suppress a decrease in the efficiency of heat exchange between the server 10 and the first refrigerant R1 and a decrease in the efficiency of heat exchange between the first refrigerant R1 and the second refrigerant R2. In addition, even when the first refrigerant R1 is leaking from the refrigerant tank 200, it is not necessary to stop the operation of the cooling device 20.

INDUSTRIAL APPLICABILITY

According to the present disclosure, it is possible to provide a monitoring device that can stabilize the state of a heat medium in a cooling device.

REFERENCE SIGNS LIST

1 Cooling system
10 Server
**10*a*** Load sensor
20 Cooling device
30 Monitoring device
40 Various sensors
41 Outside temperature sensor
200 Refrigerant tank
**200*a*** Conductivity sensor

200*b* First refrigerant temperature sensor
200*c* First liquid level Sensor
200*d* Internal pressure sensor
201 Refrigerant tank body
201*a* First tank
201*b* Second tank
202 Condenser
202*a* Condenser inlet portion
202*b* Condenser outlet portion
210 Dry cooler
210*a* Refrigerant inlet temperature sensor
210*b* Refrigerant outlet temperature sensor
210*c* Air inlet temperature sensor
210*d* Air outlet temperature sensor
210*e* Second liquid level sensor
211 Casing
211*a* Intake port
211*b* Exhaust port
212 Fan
212*a* Blade
212*b* Shaft
212*c* Fan motor
212*s* First current sensor
213 Heat exchanger
213*a* Heat exchanger inlet portion
213*b* Heat exchanger outlet portion
220 Second refrigerant line
221 High temperature line
222 Low temperature line
230 Circulation pump
230*a* Pump main body
230*b* Pump motor
230*s* Second current sensor
240 Purification device
250 Refrigerant purification line
250*a* First purification line
250*b* Second purification line
260 Purification pump
260*a* First pump
260*b* Second pump
270 Separate tank
280 Refrigerant replenishment line
290 Replenishing pump
300 Acquisition unit
310 Determination unit
320 Warning unit
330 Storage unit
340 Refrigerant purification unit
350 Refrigerant replenishing unit
1100 Computer
1110 Processor
1120 Main memory
1130 Storage
1140 Interface
A Air
Dv Vertical direction
Dvd Downward side
Dvu Upward side
Dh Horizontal direction
R1 First refrigerant
R2 Second refrigerant

The invention claimed is:

1. A monitoring device that monitors an abnormality of a cooling device, wherein the cooling device includes: a refrigerant tank that accommodates a first refrigerant for removing heat from electronic equipment in a closed space; a dry cooler that cools a second refrigerant that has exchanged heat with the first refrigerant using air outside the refrigerant tank; and a circulation pump that causes the second refrigerant to circulate between the refrigerant tank and the dry cooler through a second refrigerant line;

the monitoring device comprising:

an acquisition unit that acquires at least one set of a set including a temperature of the second refrigerant flowing into a heat exchanger in the dry cooler and a temperature of the second refrigerant flowing out of the heat exchanger, and a set including a temperature of the air flowing into the heat exchanger and a temperature of the air flowing out of the heat exchanger; and a determination unit that compares an optimal temperature corresponding to an outside temperature and a load of the electronic equipment with each of the temperatures acquired by the acquisition unit to determine whether an abnormality has occurred in one or more of the dry cooler and the circulation pump, wherein the determination unit determines that an abnormality has occurred in the circulation pump when each of the temperature of the second refrigerant flowing into the heat exchanger and the temperature of the second refrigerant flowing out of the heat exchanger is higher than the optimal temperature, and wherein the determination unit determines that an abnormality has occurred in the dry cooler when the temperature of the second refrigerant flowing out of the heat exchanger is higher than the optimal temperature.

2. The monitoring device according to claim 1, wherein the cooling device further includes a purification device that accommodates the first refrigerant independently of the refrigerant tank, and a purification pump that is driven to allow the first refrigerant in the refrigerant tank and the first refrigerant in the purification device to be replaceable through a refrigerant purification line, the acquisition unit further acquires a conductivity of the first refrigerant in the refrigerant tank, and the monitoring device further comprises a refrigerant purification unit that drives the purification pump based on the conductivity acquired by the acquisition unit.

3. The monitoring device according to claim 1, wherein the acquisition unit further acquires a liquid level of the first refrigerant in the refrigerant tank, and the determination unit further determines whether the first refrigerant is leaking from the refrigerant tank based on the liquid level acquired by the acquisition unit.

4. The monitoring device according to claim 3, wherein the cooling device further includes a separate tank that accommodates the first refrigerant independently of the refrigerant tank, and a replenishing pump that is driven to allow the first refrigerant to be supplied from the separate tank to the refrigerant tank through a refrigerant replenishing line, and the monitoring device further comprises a refrigerant replenishing unit that drives the replenishing pump when the determination unit determines that the first refrigerant is leaking from the refrigerant tank.

* * * * *